United States Patent
Nakajima et al.

(10) Patent No.: US 12,534,399 B2
(45) Date of Patent: Jan. 27, 2026

(54) LAMINATE AND MANUFACTURING METHOD OF SEMICONDUCTOR DEVICE

(71) Applicant: TORAY INDUSTRIES, INC., Tokyo (JP)

(72) Inventors: Risano Nakajima, Otsu (JP); Yukari Arimoto, Otsu (JP); Mika Koshino, Otsu (JP); Hitoshi Araki, Otsu (JP); Masao Tomikawa, Otsu (JP); Takenori Fujiwara, Otsu (JP); Kenta Aoshima, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 337 days.

(21) Appl. No.: 18/284,107

(22) PCT Filed: Mar. 23, 2022

(86) PCT No.: PCT/JP2022/013453
§ 371 (c)(1),
(2) Date: Sep. 26, 2023

(87) PCT Pub. No.: WO2022/210154
PCT Pub. Date: Oct. 6, 2022

(65) Prior Publication Data
US 2024/0166556 A1    May 23, 2024

(30) Foreign Application Priority Data
Apr. 1, 2021    (JP) .................................. 2021-062609

(51) Int. Cl.
B32B 15/04    (2006.01)
B32B 17/06    (2006.01)
(Continued)

(52) U.S. Cl.
CPC ...... *C03C 17/3405* (2013.01); *H01L 25/0753* (2013.01); *C03C 2217/78* (2013.01); *C03C 2218/116* (2013.01); *C03C 2218/32* (2013.01)

(58) Field of Classification Search
CPC ............................ C03C 17/3405; C08L 79/08
(Continued)

(56) References Cited

U.S. PATENT DOCUMENTS 9,650,723 B1 * 5/2017 D'Evelyn ................. C30B 9/00
10,751,980 B2 * 8/2020 Sawamoto .............. B32B 27/34
(Continued)

FOREIGN PATENT DOCUMENTS

JP    2014-515883 A    7/2014
JP    2020-149985 A    9/2020
(Continued)

OTHER PUBLICATIONS

International Search Report (PCT/ISA/210), issued in PCT/JP2022/013453, dated May 24, 2022.
(Continued)

*Primary Examiner* — Lauren R Colgan
(74) *Attorney, Agent, or Firm* — Birch, Stewart, Kolasch & Birch, LLP

(57) ABSTRACT

Provided is a laminate that can be implemented with a wide processing margin and without adhesive residue or damage to a semiconductor element in the transfer of the semiconductor element using laser light of various wavelengths. The laminate is obtained by laminating a substrate 1 having laser permeability, a resin film 1 and a resin film 2 in this order, wherein the light absorbance of the resin film 1 calculated for a film thickness of 1.0 μm at any wavelength of 200 nm
(Continued)

to 1100 nm is 0.4-5.0, and the adhesive strength of the surface of the resin film 2 on the side opposite that of the resin film 1 side is 0.02-0.3 N/cm.

17 Claims, 4 Drawing Sheets

(51) Int. Cl.
    *C03C 17/34*     (2006.01)
    *H01L 25/075*     (2006.01)

(58) Field of Classification Search
    USPC .......................................................... 428/426
    See application file for complete search history.

(56) References Cited

U.S. PATENT DOCUMENTS

| | | | | |
|---|---|---|---|---|
| 2014/0008115 A1* | 1/2014 | Sato | ........................ | C08J 7/043 |
| | | | | 174/258 |
| 2014/0238592 A1* | 8/2014 | Marinov | ............... | B32B 37/025 |
| | | | | 156/272.8 |
| 2018/0093461 A1* | 4/2018 | Utashiro | .............. | C08K 5/5419 |
| 2020/0062906 A1* | 2/2020 | Jeong | ................. | C08G 73/1067 |
| 2020/0139691 A1* | 5/2020 | Fujiki | ..................... | H05B 33/02 |
| 2020/0234993 A1* | 7/2020 | Prenger | .................. | C08G 69/26 |
| 2021/0341659 A1* | 11/2021 | Matsui | ..................... | G02B 1/04 |

FOREIGN PATENT DOCUMENTS

| | | |
|---|---|---|
| WO | WO 2014/050820 A1 | 4/2014 |
| WO | WO 2016/162906 A1 | 9/2016 |
| WO | WO 2016/167296 A1 | 10/2016 |
| WO | WO 2017/170021 A1 | 10/2017 |
| WO | WO 2019/207920 A1 | 10/2019 |
| WO | WO 2020/080276 A1 | 4/2020 |
| WO | WO 2020/189273 A1 | 9/2020 |

OTHER PUBLICATIONS

Written Opinion of the International Searching Authority (PCT/ISA/237), issued in PCT/JP2022/013453, dated May 24, 2022.

* cited by examiner

6a

6b

LAMINATE AND MANUFACTURING METHOD OF SEMICONDUCTOR DEVICE

TECHNICAL FIELD

The present invention relates to a laminate and a production method for a semiconductor device. More specifically, it relates to a laminate that serves suitably in mounting semiconductor elements by the laser transfer technique and also relates to a semiconductor device production method that uses it.

BACKGROUND ART

In general, elements to be incorporated in a semiconductor device are transferred and mounted on a circuit board or the like by the pick-and-place method using a tool such as flip chip bonder. In recent years, advanced and compact semiconductor devices have come in wider use. Accordingly, elements for use in them have also been miniaturized and slimmed down, and the number of these elements being installed in them has been increasing. Displays in which light-emitting diodes (LEDs), which are a type of semiconductor element, are arrayed as pixels have attracted attention recently because of their good features such as high brightness, low power consumption, and high image quality. The LEDs mounted in these pixels, which are called micro LEDs, are small type LEDs with sides of several hundred to several tens of micrometers. Manufacturing of micro LED displays by the above mounting method takes much time, and many investigations are now being made to develop new methods.

As a method for mounting a large number of small semiconductor elements, there is a technique that uses an adhesive stamp made of silicone resin or the like to mount chips from a wafer onto a circuit board (Patent documents 1 and 2). In this method, the adhesive stamp can hold more than one micro LED chip and serves to allow many chips to be placed on a circuit board in one pick-and-place process. In addition, another technique has been proposed in which chips are transferred from a wafer to a substrate designed for their transfer that has an adhesive layer and then transferred and mounted onto a circuit board or the like by the laser lift-off (LLO) technique (Patent documents 3, 4, and 5). This technique is advantageous because it serves to transfer chips with high speed and high positional accuracy.

PRIOR ART DOCUMENTS

Patent Documents

Patent document 1: Published Japanese Translation of PCT International Publication JP 2017-531915
Patent document 2: Japanese Unexamined Patent Publication (Kokai) No. 2020-129638
Patent document 3: Japanese Unexamined Patent Publication (Kokai) No. 2020-188037
Patent document 4: Japanese Unexamined Patent Publication (Kokai) No. 2010-251359
Patent document 5: Published Japanese Translation of PCT International Publication JP 2014-515883

SUMMARY OF INVENTION

Problems to be Solved by the Invention

In the inventions described in Patent documents 1 and 2, the size of the stamp depends on the wafer size, and therefore, there is a limit to the number of semiconductor elements that can be transferred simultaneously. In addition, the inventions described in Patent documents 1 and 2 have problems such as the need to prepare a stamp that suites the design of the intended circuit board. On the other hand, although the LLO technique is free of area-related constraints and does not require the production of stamps of different designs, possibly serving to realize cost reduction, the inventions proposed in Patent documents 3 and 4, which include the removal of an adhesive layer by laser ablation, require the formation of a very thin adhesive layer and are likely to cause a reduction in yield due to a decrease in in-plane uniformity. Moreover, the inventions proposed in Patent documents 3 and 4 require the application of an excessive quantity of laser beam so that the adhesive layer is removed completely by ablation in order to prevent the substrate from being contaminated by residue of the adhesive layer left on the surface of the semiconductor elements or by the material of the adhesive layer that is scattered by ablation. This can cause problems since it can lead to damage such as destruction of semiconductor elements (hereinafter, such residue of the adhesive layer on the semiconductor element surface will be occasionally referred to as adhesive residue, and such scattered residue of the adhesive layer as debris). In the case of Patent document 5, the adhesive layer and the laser absorption layer are separated, and this allows transfer to be achieved with low energy and reduces damage to semiconductor elements. However, the range of laser energy that allows efficient transfer is narrow, and the transfer property changes depending on the laser intensity, resulting in a problem relating to the process margin required to realize transfer in a practical way.

Means of Solving the Problems

To solve the above problems, the present invention provides a laminate including a substrate 1 with laser transparency, a resin film 1, and a resin film 2 stacked in this order wherein the absorbance of the resin film 1 converted to a film thickness of 1.0 μm is 0.4 or more and 5.0 or less at a wavelength in the range of 200 to 1,100 nm while the surface of the resin film 2 opposite to the one in contact with the resin film 1 has an adhesive strength of 0.02 N/cm or more and 0.3 N/cm or less.

Advantageous Effects of the Invention

By means of the laminate according to the present invention, the transfer of semiconductor elements can be performed using laser beams of various wavelengths over a wide range of process margin without adhesive residue or damage to elements.

DESCRIPTION OF PREFERRED EMBODIMENTS

Figure 1:
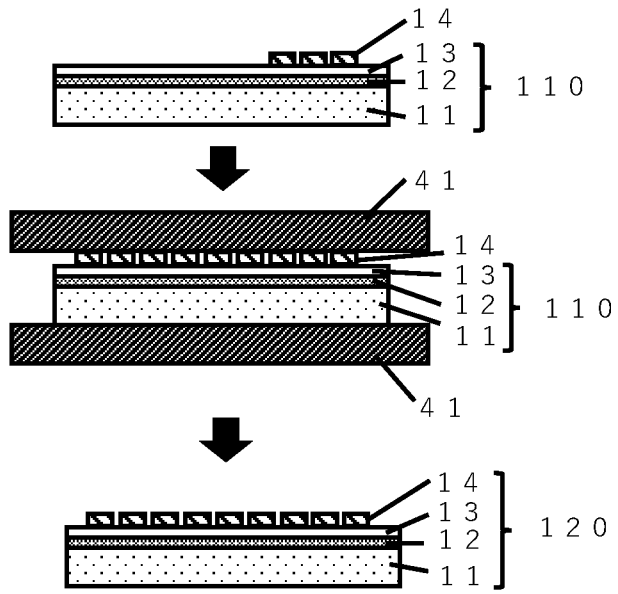
FIG. 1 This is a diagram illustrating a method for producing a laminate 2. Hereinafter, a laminate in which semiconductor elements are laid will be occasionally referred to as a laminate 2.

The laminate according to the present invention includes a substrate 1 with laser transparency, a resin film 1, and a resin film 2 stacked in this order wherein the absorbance of the resin film 1 converted to a film thickness of 1.0 µm is 0.4 or more and 5.0 or less at a wavelength in the range of 200 to 1,100 nm while the surface of the resin film 2 opposite to the one in contact with the resin film 1 has an adhesive strength of 0.02 N/cm or more and 0.3 N/cm or less. Hereinafter, a laminate having such a structure will be referred to as a laminate 1. The laminate 1 according to the present invention and the laminate 2 according to the present invention will be occasionally referred to simply as laminates according to the present invention.

Various components of the laminate according to the present invention 1 are described below.

The substrate 1 with laser transparency refers to a substrate having an absorbance of 0.1 or less at least somewhere in the wavelength range of 200 to 1,100 nm. Examples of substrates with such an absorbance include inorganic substrates such as quartz, sapphire, alkali glass, non-alkali glass, and borosilicate glass. The substrate may have any thickness as long as it does not impair the aforementioned absorbance, but it is preferably in the range of 0.1 mm to 5.0 mm. From the viewpoint of handling of the substrate, it is preferably 0.3 mm or more, and from the viewpoint of general availability, it is preferably 2.0 mm or less.

As the substrate 1 with laser transparency, it is also possible to use an organic substrate such as of PET, aramid, polyester, polypropylene, and cycloolefin. When an organic substrate is used, it may have any thickness as long as it does not impair the aforementioned absorbance, but it is preferably in the range of 0.05 mm to 3.0 mm. From the viewpoint of handling of the substrate, it is preferably 0.1 mm or more, and from the viewpoint of the suppression of light scattering during laser irradiation, it is preferably 1.0 mm or less.

Next, the resin film 1 is described below.

The resin film 1 is one at least containing resin, and the absorbance of the resin film converted to a film thickness of 1.0 µm is 0.4 or more and 5.0 or less at a wavelength in the range from 200 to 1,100 nm. If this absorbance is 0.4 or more, it allows the applied laser beam to be absorbed intensively by the resin film 1 when the laser beam is applied through the substrate 1 with laser transparency toward the resin film 1 in order to transfer semiconductor elements to the opposite substrate. It is more preferable for the absorbance to be 0.6 or more because it allows the laser beam to be absorbed particularly near the outermost surface of the resin film 1, thus facilitating transfer by a laser beam with even lower energy density. Furthermore, from the viewpoint of material design, it is preferable for the absorbance to be 5.0 or less, and still more preferably 4.0 or less to allow the use of a general-purpose resin.

As for the resin to incorporate in the resin film 1, good examples include, but not limited to, resins that have absorption somewhere in the range of 200 to 1,100 nm, such as polyimide, polyimide precursor, polybenzoxazole, polybenzoxazole precursor, urethane resin, novolac resin, polyhydroxystyrene, polyester resin, acrylic resin, and aramid resin.

It is desirable for these resins to have conjugated structures in their structures. If these resins have conjugated structures, it serves to allow the converted absorbance at a film thickness of 1.0 µm measured at a wavelength between 200 and 1,100 nm to be in the range of 0.4 or more and 5.0 or less. Examples of structures having conjugated structures include aromatic ones and in particular, it is preferable for them to have such structures as biphenyl, imide, benzoxazole, and benzophenone. An absorbance in the above range can be achieved by adjusting the content of monomer residues with conjugated structures so that they account for 60 mol % or more of all monomer residues, which account for 100 mol %, in the resins that are contained in the resin film 1. The resin film 1 may contain only one of these resins or may contain a plurality thereof.

An absorbance as specified above can be realized also by adding additives such as ultraviolet absorber, coloring matter, dyes, and pigments. Examples of additives that can be contained in the resin film 1 include ultraviolet absorbers such as Tinuvin PS, Tinuvin 99-2, Tinuvin 326, Tinuvin 328, Tinuvin 384-2, Tinuvin 400, Tinuvin 405, Tinuvin 460, Tinuvin 477, Tinuvin 479, Tinuvin 900, Tinuvin 928, and Tinuvin 1130 (all trade names, manufactured by BASF), and DAINSORB T-0, DAINSORB T-7, DAINSORB T-31, DAINSORB T-52, DAINSORB T-53, DAINSORB T-84, DAINSORB P-6, and DAINSORB P-7 (all trade names, manufactured by Daiwa Kagaku); coloring matter such as Solvent Yellow 93, Solvent Yellow 33, Solvent Orange 60, Solvent Red 111, Solvent Red 135, Solvent Red 168, Solvent Red 207, Solvent Red 52, Solvent Red 179, Solvent Blue 36, Solvent Blue 94, Solvent Blue 63, Solvent Blue 104, Solvent Blue 97, Solvent Green 20, Solvent Violet1 3, and Solvent Violet 36 (all trade names, manufactured by Tokyo Chemical Industry Co., Ltd.); infrared ray absorbents such as diimonium based near infrared ray absorbent, aminium based near infrared ray absorbent, anthraquinone based near infrared ray absorbent, phthalocyanine based near infrared ray absorbent, nickel complex based near infrared ray absorbent, polymethine based near infrared ray absorbent, diphenyl methane based near infrared ray absorbent, and triphenyl methane based near infrared ray absorbent; and pigments such as carbon black, perylene black, cyanine black, and aniline black.

The resin film 1 may contain only one of these or may contain a plurality thereof. In regard to the amount of additives required to control the absorbance in the aforementioned range, they preferably account for 0.1 part by weight or more relative to 100 parts by weight of the resin film 1 used for the present invention, and from the viewpoint of its stability in the state of varnish prepared before forming a laminate, they preferably account for 50 parts by weight or less.

The resin film 1 may further include a silane compound as needed. If a silane compound is included, it can serve to adjust the adhesion between the resin film 1 and the substrate 1 with laser transparency. This can prevent the resin film 1 in the region not irradiated with the laser beam from being removed from the substrate 1 with laser transparency. Specific examples of such a silane compound include N-phenylaminoethyl trimethoxysilane, N-phenylaminoethyl triethoxysilane, N-phenylaminopropyl trimethoxysilane, N-phenylaminopropyl triethoxysilane, N-phenylaminobutyl trimethoxysilane, N-phenylaminobutyl triethoxysilane, vinyl trimethoxysilane, vinyltriethoxysilane, vinyltrichlorosilane, vinyl tris-(β-methoxyethoxy)silane, 3-methacryloxypropyl trimethoxysilane, 3-acryloxypropyl trimethoxysilane, p-styryl trimethoxysilane, 3-methacryloxypropylmethyl dimethoxysilane, and 3-methacryloxypropylmethyl diethoxysilane. In regard to the quantity of the silane compound, it preferably accounts for 0.01 part by weight or more and 15 parts by weight or less relative to 100 parts by weight of the resin film 1 used for the present invention.

Additionally, if necessary, the resin film 1 may contain a surfactant for the purpose of improving the coating compatibility with the substrate 1 with laser transparency during film formation to allow the resulting resin film 1 to have a uniform thickness.

It is more preferable for the resin film 1 to show an absorbance as specified above at a wavelength selected from 248 nm, 266 nm, 308 nm, 355 nm, 532 nm, and 1,064 nm. For the resin film 1, the converted absorbance at a film thickness of 1.0 μm is preferably 0.4 or more and 5.0 or less at a wavelength selected from 248 nm, 266 nm, 308 nm, 355 nm, 532 nm, and 1,064 nm.

It is still preferable for the resin film 1 to show an absorbance as specified above at a wavelength selected from 248 nm, 266 nm, and 355 nm. For the resin film 1, it is preferable that the converted absorbance at a film thickness of 1.0 μm be 0.4 or more and 5.0 or less at a wavelength selected from 248 nm, 266 nm, and 355 nm. If the resin film 1 has an absorbance as specified above at any of these wavelengths, it facilitates efficient absorption of laser energy.

Next, the resin film 2 used for the present invention is described below.

The surface of the resin film 2 opposite to the one in contact with the resin film 1 has an adhesive strength of 0.02 N/cm or more and 0.3 N/cm or less. The adhesive strength referred to herein means a value determined from 90° C. peel test for peeling between a Kapton film and the surface of the resin film 2 opposite to the one in contact with the resin film 1. A specific measurement method involves cutting out a 1 cm×9 cm piece from a Kapton film, pressing it onto the surface of the resin film 2 in a laminate 1 opposite to the one in contact with the resin film 1 under the conditions of 0.1 MPa and 25° C. using a vacuum laminator, and conducting a peeling test in which the pressure-bonded Kapton film is peeled off by pulling it at a constant speed of 2 mm/sec in the perpendicular direction to the resin film 2 using a tensile testing machine.

If the adhesive strength is 0.02 N/cm or more, it serves to allow semiconductor elements laid on the resin film 2 to be maintained stably. On the other hand, if the adhesive strength is 0.3 N/cm or less, it serves to allow the semiconductor elements to be transferred using a laser beam with a low energy density in the transfer step. The adhesive strength is more preferably 0.2 N/cm or less. If it is in this range, it serves to reduce the adhesive residue left on the semiconductor elements when the semiconductor elements are transferred by applying a laser beam through the substrate 1 with laser transparency.

The resin film 2 at least contains a resin, and in order to allow the resin film 2 to have an adhesive strength in the range specified above, it is preferable for the resin film 2 to contain a flexible component or a bent component. If a flexible component or a bent component is introduced, it acts to lower the glass transition temperature and increase the adhesive strength. Components that can work to increase the flexibility or bendability include those having flexible structures derived from aliphatic compounds, silane, etc., such as alkylene groups and siloxane, those having flexible structures derived from ether groups such as biphenyl ether, etc., and those having bent structures such as olefins. If monomer residues having these flexibility-developing structures account for 20 mol % or more of all monomer residues, which account for 100 mol %, present in the resins contained in the resin film 2, it allows the adhesive strength to be 0.02 N/cm or more. On the other hand, if monomer residues having these flexibility-developing structures account for 70 mol % or less of all monomer residues, which account for 100 mol %, present in the resins contained in the resin film 2, it allows the adhesive strength to be 0.3 N/cm or less.

Examples of resins to be incorporated in the resin film 2 include, but not limited to, polyimide, polyimide precursor, polybenzoxazole, polybenzoxazole precursor, urethane resin, novolac resin, polyester resin, acrylic resin, polyhydroxystyrene, polysiloxane, and polyimide siloxane, which should be used in appropriate amounts to realize an adhesive strength as specified above.

It is preferable for the resin film 2 present in the laminate according to the present invention to contain a crosslinking agent. If the resin film 2 contains a crosslinking agent, part of the structure can be crosslinked to harden the surface of the resin film 2, thereby serving to adjust the adhesive strength. Furthermore, as the surface of resin film 2 is strengthened as a result of crosslinking, it works more effectively to reduce the adhesive residue.

Examples of good crosslinking agents include compounds having alkoxymethyl groups or methylol groups such as DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DMLBisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (all trade names, manufactured by Honshu Chemical Industry Co., Ltd.), and NIKALAC (registered trademark) MX-290, NIKALAC MX-280, NIKALAC MX-270, NIKALAC MX-279, NIKALAC MW-100LM, and NIKALAC MX-750LM (all trade names, manufactured by Sanwa Chemical Co., Ltd.).

Also, it preferably contains a crosslinking agent having an epoxy group. Good compounds having epoxy groups include, for example, bisphenol A type epoxy resin, bisphenol F type epoxy resin, propylene glycol diglycidyl ether, polypropylene glycol diglycidyl ether, polymethyl(glycidyloxypropyl) siloxane, other epoxy-containing silicones, and dimer acid modified epoxy resins, although the present invention is not limited thereto. More specifically, examples include Epicron 850-S, Epicron HP-4032, Epicron HP-7200, Epicron HP-820, Epicron HP-4700, Epicron EXA-4710, Epicron HP-4770, Epicron EXA-859CRP, Epicron EXA-1514, Epicron EXA-4880, Epicron EXA-4850-150, Epicron EXA-4850-1000, Epicron EXA-4816, and Epicron EXA-4822 (all trade names, manufactured by DIC Corporation), as well as Rikaresin BEO-60E (trade name, manufactured by New Japan Chemical Co., Ltd.), EP-4003S and EP-4000S (both trade names, manufactured by Adeka Corporation), JER871, JER872, YX-4000, and YX-4000H (all trade names, manufactured by Mitsubishi Chemical Corporation), CELLOXIDE 2021P (trade name, manufactured by Daicel Corporation), Shofree PETG, Shofree CDMGB, and Shofree BATG (all trade names, manufactured by Showa Denko K.K.), Denacol EX-201-IM (trade name, manufactured by Nagase ChemteX Corporation), and TEPIC-VL (trade name, manufactured by Nissan Chemical Industries).

It is also preferable to contain a crosslinking agent having an oxetanyl group, and specific examples thereof include OXT-121, OXT-221, OX-SQ-H, OXT-191, PNOX-1009, and RSOX (all trade names, manufactured by Toagosei Co., Ltd.), and Eternacoll (registered trademark) OXBP and Eternacoll OXTP (both trade names, manufactured by Ube Industries, Ltd.).

The resin film 2 may contain two or more of these crosslinking agents. It can serve to reduce the amount of adhesive residue if it exists and preferably accounts for 1 part by weight or more relative to 100 parts by weight of the resin film 2. It more preferably accounts for 5 parts by weight or more relative to 100 parts by weight of the resin film 2 because in that case, the amount of adhesive residue can be decreased more effectively. On the other hand, the crosslinking agent preferably accounts for 300 parts by weight or less relative to 100 parts by weight of the resin film 2. If its amount is in this range, the resin film 2 will maintain a required flexibility, and accordingly, the resin film 2 will be prevented from tearing during the transfer of semiconductor elements. From the viewpoint of storage stability in the state of varnish before use for forming a laminate, it is more preferably 200 parts by weight or less. In particular, when the adhesive strength of the resin itself is more than 0.3 N/cm, the crosslinking agent preferably accounts for 5 parts by weight or more and 300 parts by weight or less relative to 100 parts by weight of the resin film 2. If the crosslinking agent contained accounts for 5 parts by weight or more, the adhesive strength of the resin, which is 0.3 N/cm or more, can be reduced to 0.3 N/cm or less. If it accounts for 300 parts by weight or less, the resin film 2 can maintain a required flexibility. Furthermore, it preferably accounts for 10 parts by weight or more because it serves to reduce the amount of adhesive residue, whereas it preferably accounts for 200 parts by weight or less because it serves to improve the storage stability.

In addition, a curing accelerator may also be included in order to allow the crosslinking agent to work more effectively in promoting the curing reaction. Examples of such a curing accelerator include imidazoles, tertiary amines, salts thereof, and organic boron salts, of which imidazoles are preferable. Specific examples of imidazoles include imidazole, 2-methyl imidazole, 2-ethyl imidazole, 2-isopropyl imidazole, 2-n-propyl imidazole, 2-undecyl-1H-imidazole, 2-heptadecyl-1H-imidazole, 1,2-dimethyl imidazole, 2-ethyl-4-methyl imidazole, 2-phenyl-1H-imidazole, 4-methyl-2-phenyl-1H-imidazole, 2-phenyl-4-methyl imidazole, 1-benzyl-2-methyl imidazole, 1-cyanoethyl-2-methyl imidazole, 1-cyanoethyl-2-ethyl-4-methyl imidazole, 1-cyanoethyl-2-undecyl imidazole, 1-cyanoethyl-2-phenyl imidazole, 1-cyanoethyl-2-ethyl-4-methyl imidazolium trimellitate, 1-cyanoethyl-2-undecyl imidazolium trimellitate, 1-cyanoethyl-2-phenyl imidazolium trimellitate, 2,4-diamino-6-[2'-methyl imidazolyl-(1')]-ethyl-s-triazine, 2,4-diamino-6-[2'-undecylimidazolyl-(1')]-ethyl-s-triazine, 2,4-diamino-6-[2'-ethyl-4-methylimidazolyl-(1')]-ethyl-s-triazine, 2,4-diamino-6-[2'-methylimidazolyl-(1')]-ethyl-s-triazine isocyanuric acid addition product, 2-phenyl imidazole isocyanuric acid addition product, 2-methyl imidazole isocyanuric acid adduct, 2-phenyl-4,5-dihydroxymethyl imidazole, 2-phenyl-4-methyl-5-hydroxymethyl imidazole, 1-cyanoethyl-2-phenyl-4,5-di(2-cyanoethoxy) methyl imidazole, 1-dodecyl-2-methyl-3-benzyl imidazolium chloride, 1-benzyl-2-phenyl imidazole hydrochloride, and 1-benzyl-2-phenyl imidazolium trimellitate.

Examples of commercially available products of preferable imidazoles include Curezol C17Z, Curezol 2MZ, Curezol 1B2MZ, Curezol 2E4MZ, Curezol 2E4MZ-CN, Curezol 2MZ-AZINE, and Curezol 2MZ-OK (all trade names, manufactured by Shikoku Chemicals Corporation).

In the resin film 2, the curing accelerator preferably accounts for 0.1 part by weight or more and 5.0 parts by weight or less relative to 100 parts by weight of the resin film 2. If its content is in this range, it will work sufficiently in accelerating the crosslinking reaction. Moreover, in order to maintain its stability in the state of varnish before use for forming a laminate, it is more preferable for the content to be in the range of 0.5 to 2.0 parts by weight.

The laminate according to the present invention is formed by stacking a substrate 1 with laser transparency, a resin film 1, and a resin film 2, and as long as they are stacked in this order, another layer may be present between them. However, the substrate 1 with laser transparency and the resin film 2 should form the outermost surface layers of the laminate.

The laminate according to the present invention includes a substrate 1 with laser transparency, a resin film 1, a resin film 2, and semiconductor elements stacked in this order wherein the absorbance of the resin film 1 converted to a film thickness of 1.0 μm is 0.4 or more and 5.0 or less at a wavelength in the range of 200 to 1,100 nm and also wherein the adhesive strength at the face where the resin film 2 and the semiconductor elements are in contact with each other is 0.02 N/cm or more and 0.3 N/cm or less.

The features of the substrate 1 with laser transparency, resin film 1, and resin film 2 in the laminate 2 are essentially the same as those for the laminate 1.

Described next are the semiconductor elements used for the present invention.

The semiconductor elements used for the present invention may be, for example, elements made of semiconductors such as GaN, AlN, InN, InP, GaAs, Si, and SiC. There are different types of semiconductor elements such as one containing other types of semiconductors stacked one on another and one containing an electrode material, sapphire substrate, glass substrate, wiring, etc., stacked one on another. In regard to the size of the semiconductor element, they preferably have sides of 5 μm or more and 5.0 mm or less. It is more preferable for them to have sides of 3.0 mm or less. In that case, the laser beam can be condensed and a smaller spot diameter can be realized to facilitate transfer with higher positional accuracy.

The number of semiconductor elements to be mounted on the laminate 2 according to the present invention is preferably 5/cm$^2$ or more, and more preferably 50/cm$^2$ or more. If the number of semiconductor elements is increased beyond this, it serves more effectively to allow the laser transfer process to realize a larger throughput. On the other hand, in order to irradiate each semiconductor element accurately with a laser beam, it is preferably 500,000/cm$^2$ or less, and more preferably 100,000/cm$^2$ or less.

As long as a substrate 1 with laser transparency, a resin film 1, a resin film 2, and semiconductor elements are stacked in this order in the laminate 2 according to the present invention, another layer may be present between them. However, semiconductor elements should be formed directly on the resin film 2 while the substrate 1 with laser transparency and the semiconductor elements should form the outermost surface layers of the laminate.

The laminate according to the present invention preferably has an indentation hardness H2 of 2 MPa or more and 500 MPa or less as measured by making an indentation in the direction from the resin film 2 toward the substrate 1. As compared with the indentation hardness H1 that is measured by making an indentation in the direction from the resin film 1 toward the substrate 1 after removing the resin film 2 from the laminate, it is preferable that the relation H1>H2 is satisfied.

After removing semiconductor elements from the resin film 2, the laminate 2 has an indentation hardness H2 of 2 MPa or more and 500 MPa or less as measured by making an indentation in the direction from the resin film 2 toward the substrate 1. As compared with the indentation hardness H1 that is measured by making an indentation in the direction from the resin film 1 toward the substrate 1 with laser transparency after removing semiconductor elements and the resin film 2 from the laminate 2, it is preferable that the relation H1>H2 is satisfied. The indentation hardness is a property that serves as an index when forming semiconductor elements on the resin film 2. If it is controlled in an appropriate range, it facilitates the formation of semiconductor elements on the resin film 2 and serves to ensure an improved accuracy in the subsequent transfer of semiconductor elements by laser beam irradiation.

The measurement of indentation hardness H2 can be performed using a nanoindenter. In the case of a laminate 2, to enable hardness measurement, an appropriate number of semiconductor elements are physically removed from the laminate 2 to expose the surface of the resin film 2 to allow its measurement to be performed. Useful methods for removing semiconductor elements include one in which tweezers are used for direct removal of them and one in which a substrate, film, or other material that has large adhesive strength, such as dicing tape, is overlaid on the top surface of the semiconductor elements, followed by peeling it off. Measurements of indentation hardness are taken by carrying out an indentation loading/unloading test in a room-temperature, atmospheric pressure atmosphere. In the test, an indentation is made from the surface of the resin film 2 toward the resin film 1 in a sample using a Berkovich indenter (triangular pyramid diamond indenter), followed by removing the load. Here, measurements are taken at a measuring frequency of 100 Hz using the continuous rigidity measurement method. Based on the resulting load-indentation depth curve, the indentation hardness can be calculated from values in the indentation region where the underlying substrate has no influence.

In the case of the laminate 1, the measurement of indentation hardness H1 is performed after removing the resin film 2 by dry etching to expose the surface of the resin film 1. In the case of the laminate 2, semiconductor elements are physically removed by the method described above, and then the resin film 2 is removed by dry etching to expose the surface of resin film 1. Before the dry etching of the resin film 2, dry etching is performed at a site different from the intended measuring site and the etching rate of resin film 2 is calculated. Then, the removal of resin film 2 is performed based on the results of calculation. After that, the components existing on the surface of the resin film are analyzed by the ATR-IR technique. The removal of the resin film 2 is confirmed when components of the resin film 2 are no longer detected. The indentation hardness H1 can be measured with a nanoindenter according to the same procedure as for the indentation hardness H2. The conditions of the nanoindenter used for measuring the indentation hardness H1 are the same as those for measuring the indentation hardness H2.

When the indentation hardness H2, which is measured by making an indentation in the direction from the resin film 2 toward the substrate 1, is 2 MPa or more, the semiconductor elements will be prevented from being embedded into the resin film 2 even if semiconductor elements are laid on the resin film 2 by pressing the elements using a vacuum laminator or wafer bonder. Since the resin film 2 does not adhere to the side face of the semiconductor elements, their transfer can be performed using a laser beam with low energy density. Furthermore, if the indentation hardness H2 is 500 MPa or less, it allows semiconductor elements to be laid without suffering breakage even if pressure is applied when laying the semiconductor elements. It is more preferable for the indentation hardness H2 to be 300 MPa or less. If the indentation hardness H2 is 300 MPa or less, it serves to ensure an improved yield in laying the semiconductor elements on resin film 2.

In addition, if a comparison between the indentation hardness H1 and the indentation hardness H2 shows that the relation H1>H2 is satisfied, the interface between the resin film 1 and the resin film 2 is maintained uniform when pressing the semiconductor elements on the resin film 2, thereby realizing a high positional accuracy in performing transfer with a laser beam.

For the laminate according to the present invention, the value of (t1+t2), where t1 (μm) and t2 (μm) are the thickness of the resin film 1 and that of the resin film 2, respectively, is preferably 1.0 μm or more and 30 μm or less, and the ratio of t1/t2 is preferably 0.1 or more and 5.0 or less. If the value of (t1+t2) is 1.0 μm or more, the heat generated from the irradiation with a laser beam is prevented from being transmitted significantly to the semiconductor elements, and damage to the semiconductor elements can be suppressed. On the other hand, if the value of (t1+t2) is 30 μm or less, the deformation brought about by the ablation of the resin film 1 that is caused by the application of a laser beam through the substrate 1 with laser transparency is transmitted efficiently to the interface between the resin film 2 and the semiconductor elements, and as a result, this allows the semiconductor elements to be transferred. It is preferable for the value of (t1+t2) to be 20 μm or less because it allows the semiconductor elements to be transferred to the opposite substrate with high positional accuracy.

In addition, it is preferable for the ratio t1/t2 to be 0.1 or more and 5.0 or less. If the ratio t1/t2 is 0.1 or more, the energy brought about by the ablation of the resin film 1 that is caused by the application of a laser beam through the substrate 1 with laser transparency travels without decay through the resin film 2 and reaches its interface with the semiconductor elements, thus allowing the semiconductor elements to be transferred. On the other hand, if the ratio t1/t2 is 5.0 or less, it works to prevent the resin film 2 from being broken by the energy resulting from the ablation of the resin film 1 that is caused by the application of a laser beam. Consequently, this works to prevent part of the resin film 1 or the resin film 2 from being scattered as debris toward the opposite substrate and causing damage to the substrate. It is more preferable for the ratio t1/t2 to be 0.3 or more and 3.0 or less.

It is preferable for the resin film 1 in the laminate according to the present invention to have an elongation at break of 2.0% or more and 30% or less. If the resin film 1 has an elongation at break of 2.0% or more, it can prevent the resin film 1 from being peeled off from the adjacent substrate or film due to impacts other than laser beam irradiation.

If the elongation at break of the resin film 1 is 30% or less, breakage of the resin film 1 will occur at the boundary between irradiated and unirradiated areas when a laser beam is applied, and this enables accurate transfer of only the semiconductor elements in the irradiated area. The mechanism for transferring semiconductor elements by laser beam irradiation generally involves the ablation of the laser beam-absorbing layer at the interface between the substrate with laser transparency and the laser beam-absorbing layer, which allows the semiconductor elements to be transferred by the pressure of the generated decomposition gas. In the laminate according to the present invention, in addition to the above effect, the areas of the resin film 1 that are irradiated with a laser beam are broken and fall onto the resin film 2. As a result, the impact of the falling of the broken parts of the resin film 1 can also be used as energy for transferring the semiconductor elements to serve for improving the positional accuracy, and this facilitates their transfer with lower energy laser beam irradiation, thus leading to a large increase in the processing margin.

It is more preferable for the resin film 1 to have an elongation at break of 5% or more and 25% or less. If the resin film 1 has an elongation at break of 5% or more, the possibility that the resin film 1 is peeled off by impacts other than laser beam irradiation further decreases, making storage and transport of a laminate easier. On the other hand, if the elongation at break of the resin film 1 is 25% or less, this is more preferable because transfer can be achieved with lower energy.

For the resin film 1 to have an elongation at break as specified above, it is preferable for the resin contained in the resin film 1 to have a rigid structure. Preferable examples of such a rigid structure include those having aromatic rings, condensed rings, olefins, alkyl groups having 1 to 3 carbon atoms, or the like. In particular, the rigid structure is preferably an aromatic ring or a condensed ring in order to avoid a decrease in absorbance. Rigid structures do not stretch significantly and therefore can serve to maintain an elongation at break of 30% or less. In addition, these structures are so sturdy that they can maintain an elongation at break of 2% or more. Specifically, the elongation at break can be in the range specified above, if monomer residues having rigid structures account for 50 mol % or more of all monomer residues, which account for 100 mol %, present in the resin contained in the resin film 1.

Furthermore, the elongation at break of the resin film 1 can be adjusted in the range of 2.0% or more and 30% or less also by controlling the molecular weight, which can be achieved by changing the proportions of the monomers when polymerizing the resin. For instance, when polyimide is to be used for preparing the resin film 1, it may be polymerized from diamine and dianhydride, used as monomers, mixed at a non-equally divided ratio, for example 98:100 moles, to produce a resin having a lower molecular weight. In general, when a resin having a lower molecular weight is used, the degree of entanglement of molecules will decrease and accordingly, the elongation at break will become smaller. For a resin with an elongation at break of more than 30%, the elongation at break can be reduced to 30% or less if its molecular weight is decreased by the method described above. On the other hand, for a resin with an elongation at break of less than 2%, the elongation at break can be raised to 2% or more if its molecular weight is increased. In regard to the molecular weight of a resin, it is preferable to have a weight average molecular weight in the range of 1,000 to 100,000.

When forming the resin film 1, the elongation at break of the film can also be adjusted in the above range by controlling the packing state of the resin through heat treatment. In the case of structures that contain aromatic rings, it can be adjusted by controlling the in-plane packing of aromatic rings whereas in the case of structures that contain alkyl chains, it can be adjusted by controlling the packing state among the alkyl chains. For example, in the case where the resin component contained in the resin film 1 is a polyimide having aromatic rings, the aromatic rings in the resin cannot achieve sufficient packing, resulting in a lower elongation at break, if the heat treatment temperature is lower than 200° C. On the other hand, the elongation at break can be increased if the heat treatment temperature is raised to 200° C. or higher as long as the resin has heat resistance in this temperature range. In addition, as compared with curing in an inert gas atmosphere, the elongation at break will decrease when it is cured in air. The use of these film production methods in combination with a resin having an appropriate constitution makes it possible to achieve an elongation at break in the range specified above.

The laminate according to the present invention preferably has an indentation hardness H1 of 50 MPa or more and 1,000 MPa or less as measured by making an indentation in the direction from the resin film 1 toward the substrate 1. If the indentation hardness H1 is in this range, the resin film 1 will be easily broken when irradiated with a laser beam, leading to an improved transfer property.

An indentation hardness H1 in this range can be achieved when monomer residues having aromatic rings account for 50 mol % or more of all monomer residues, which account for 100 mol %, present in the resin contained in the resin film 1. Furthermore, as in the case of the elongation described above, the indentation hardness H1 changes with the packing state in the resin and therefore, it is possible to adjust it by changing the curing temperature used for forming the resin film 1. Specifically, the indentation hardness H1 decreases when the heat treatment temperature of the resin film 1 is 200° C. or less while the value of the indentation hardness H1 increases when the heat treatment temperature is higher than 200° C. The optimal temperature range and hardness range that can be adjusted vary depending on the type of resin, and in the case where the resin film 1 contains polyamic acid, for example, the conversion from polyamic acid to imide proceeds in the range of 180° C. to 300° C. This causes changes in the packing of the film and serves for the adjustment of hardness. Furthermore, the addition of a crosslinking agent causes crosslinking in the film and also serves to increase its hardness. For a resin that is low in hardness, therefore, the combined use of a crosslinking agent serves for the adjustment.

The indentation hardness H1, which is measured by making an indentation in the direction from the resin film 1 toward the substrate 1, is more preferably in the range of 80 MPa to 800 MPa. If it is in this range, it serves to further improve the positional accuracy of the elements transferred by laser beam irradiation.

It is preferable for the resin film 2 in the laminate according to the present invention to have an elongation at break of 100% or more and 1,000% or less. For the present invention, the resin film 2 works not only to hold semiconductor elements but also to catch the broken pieces of the resin film 1 resulting from laser beam irradiation during the transferring step and apply their momentum to peeling the semiconductor elements from the surface of the resin film 2 and transferring them. If the elongation at break of the resin film 2 is 100% or more, the resin film 2 will not be broken even when it catches broken pieces of the resin film 1. This can suppress the generation of debris from the resin film 1 and the resin film 2 during the transferring step and prevent contamination of the opposite substrate. On the other hand, if the elongation at break of the resin film 2 is 1,000% or less, it prevents the laser-unirradiated areas of the resin film 2 from being deformed as they are pulled by the laser-irradiated areas of the resin film 2 that are being deformed. It is more preferably 200% or more and 800% or less. If it is controlled in this range, a laser beam to use for irradiation can be selected from a wide range of energy density, and as a result, it acts to improve the process margin.

To allow the resin film 2 to have such properties, it is preferable for the resin contained in the resin film 2 to have a structure with flexibility. Examples of such structures with flexibility include alkylene structures, siloxane structures, and alkylene glycol structures. Specifically, this is realized by adding monomer residues with flexible structures in such a manner that these monomer residues account for 20 mol % or more of all monomer residues, which account for 100 mol %, that are present in the resin contained in the resin film 2. It is more preferable for the monomer residues with flexible structures to account for 30 mol % or more of all monomer residues, which account for 100 mol %, that are present in the resin.

For the laminate according to the present invention, it is preferable for the resin film 1 to include one or more selected from the group consisting of a polyimide having a structure as represented by the formula (1), a polyimide precursor having a structure as represented by the formula (2), a polybenzoxazole having a structure as represented by the formula (3), a polybenzoxazole precursor having a structure as represented by the formula (4), and copolymers thereof.

[Chemical compound 1]

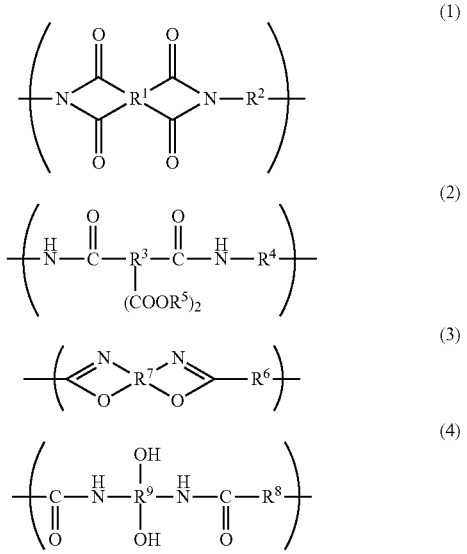

In the formulae (1) to (4), $R^1$, $R^3$, $R^7$, and $R^9$ each independently represent a tetravalent organic group having 6 to 40 carbon atoms, and $R^2$, $R^4$, $R^6$, and $R^8$ each independently represent a divalent organic group having 2 to 40 carbon atoms. $R^5$ represents a hydrogen atom or a monovalent organic group having 1 to 20 carbon atoms.

Polyimide and polybenzoxazole are resins having a cyclic structure, namely an imide ring or an oxazole ring, in the backbone chain structures. Furthermore, their precursors, namely, polyimide precursor and polybenzoxazole precursor, are resins that form an imide ring or a benzoxazole ring structure when dehydrated and cyclized. Each structure as represented by the formulae (1) to (4) serves as a repeating unit, and it is preferable for the resin to include 10 to 100,000 units thereof. If the number is in this range, it allows the resin film 1 to be spread to an appropriate film thickness.

Polyimide can be produced by reacting a tetracarboxylic acid, or a corresponding substance such as tetracarboxylic dianhydride and tetracarboxylic acid diester dichloride, with a diamine, or a corresponding substance such as diisocyanate compound and trimethylsilylated diamine, and it contains a tetracarboxylic acid residue and a diamine residue. For example, it can be produced by performing heat treatment to dehydrate and cyclize polyamic acid, which is a polyimide precursor and is formed by reacting a tetracarboxylic dianhydride and a diamine. During this heat treatment, a solvent, such as m-xylene, that forms an azeotropic mixture with water can also be added. As another method for its production, a dehydration condensation agent such as carboxylic anhydride and dicyclohexyl carbodiimide and a base such as triethyl amine that works as a cyclization catalyst may be added, followed by chemical heat treatment to cause dehydration and cyclization. As still another method, it can be produced by adding a weakly acidic carboxylic acid compound and performing heat treatment for dehydration and cyclization at a low temperature of 100° C. or less.

Polybenzoxazole can be produced by reacting a bisaminophenol compound with a dicarboxylic acid or a corresponding substance such as dicarboxylic acid chloride and dicarboxylic acid active ester, and contains a dicarboxylic acid residue and a bisaminophenol residue. For example, it can be produced by subjecting polyhydroxyamide, which is a polybenzoxazole precursor and is formed by reacting a bisaminophenol compound and a dicarboxylic acid, to heat treatment to cause dehydration and cyclization. As another method, it can also be produced by adding a phosphoric anhydride, a base, a carbodiimide compound, etc., followed by chemical treatment to cause dehydration and cyclization.

In the formulae (1) and (2), $R^1$ and $R^3(COOR^5)$ each represent a tetracarboxylic acid residue. Examples of the tetracarboxylic acid residues that serve to form $R^1$ or $R^3(COOR^5)$ include residues of aromatic tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenone tetracarboxylic acid, 2,2',3,3'-benzophenone tetracarboxylic acid, 2,2-bis(3,4-dicarboxyphenyl) hexafluoropropane, 2,2-bis(2,3-dicarboxyphenyl) hexafluoropropane, 1,1-bis(3,4-dicarboxyphenyl) ethane, 1,1-bis(2,3-dicarboxyphenyl) ethane, bis(3,4-dicarboxyphenyl) methane, bis(2,3-dicarboxyphenyl) methane, bis(3,4-dicarboxyphenyl) sulfone, bis(3,4-dicarboxyphenyl) ether, 1,2,5,6-naphthalene tetracarboxylic acid, 2,3,6,7-naphthalene tetracarboxylic acid, 2,3,5,6-pyridine tetracarboxylic acid, and 3,4,9,10-perylene tetracarboxylic acid; and residues of aliphatic tetracarboxylic acids such as butanetetracarboxylic acid and 1,2,3,4-cyclopentane tetracarboxylic acid. It may also be effective to use two or more of these tetracarboxylic acid residues in combination. The use of a tetracarboxylic acid residue that has an aromatic structure is preferable from the viewpoint of absorbance.

In the formulae (1) and (2), $R^2$ and $R^4$ each represent a diamine residue. Examples of the diamine residues that serve to form $R^2$ or $R^4$ include residues of diamines containing hydroxyl groups such as 2,2-bis(3-amino-4-hydroxyphenyl) hexafluoropropane, bis(3-amino-4-hydroxyphenyl) sulfone, 2,2-bis(3-amino-4-hydroxyphenyl) propane, bis(3-amino-4-hydroxyphenyl) methane, bis(3-amino-4-hydroxyphenyl) ether, 3,3'-diamino-4,4'-biphenol, and 9,9-bis(3-amino-4-hydroxyphenyl) fluorene; residues of diamines containing sulfonic acid groups such as 3-sulfonic acid-4,4'-diaminodiphenyl ether; residues of diamines containing thiol groups such as dimercaptophenylene diamine; residues of aromatic diamines such as 3,4'-diaminodiphenyl ether, 4,4'-diaminodiphenyl ether, 3,4'-diaminodiphenyl methane, 4,4'-diaminodiphenyl methane, 3,4'-diaminodiphenyl sulfone, 4,4'-diaminodiphenyl sulfone, 3,4'-diaminodiphenyl sulfide, 4,4'-diaminodiphenyl sulfide, 1,4-bis(4-aminophenoxy) benzene, benzidine, m-phenylene diamine, p-phenylene diamine, 1,5-naphthalene diamine, 2,6-naphthalene diamine, bis(4-aminophenoxyphenyl) sulfone, bis(3-aminophenoxyphenyl) sulfone, bis(4-aminophenoxy) biphenyl, bis{4-(4-aminophenoxy)phenyl} ether, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, and 2,2'-bis(trifluoromethyl)-4,4'-diaminobiphenyl; compounds produced by substituting part of the hydrogen atoms in aromatic rings in these substances with alkyl groups having 1 to 10 carbon atoms, fluoroalkyl groups, or halogen atoms; and residues of alicyclic diamines such as cyclohexyl diamine and methylenebiscyclohexyl amine. In addition, aliphatic diamine residues can also be used, and examples thereof include diamine residues containing polyethylene oxide groups such as Jeffamine KH-511, Jeffamine ED-600, Jeffamine ED-900, Jeffamine ED-2003, Jeffamine EDR-148, and Jeffamine EDR-176, as well as D-200, D-400, D-2000, and D-4000, which are products of polyoxy propylene diamine (all trade names, manufactured by HUNTSMAN); and diamine residues containing polyalkylene oxide groups such as ELASMER 250P, ELASMER 650P, ELASMER 1000P, and Porea SL 100A (all trade names, manufactured by Kumiai Chemical Industry Co., Ltd.). In addition, it is also possible to use a siloxanediamine residue, and examples thereof include a propylamine-terminated siloxanediamine such as LP-7100, KF-8010, KF-8012, and X-22-161A (all trade names, manufactured by Shin-Etsu Chemical Co., Ltd.). It may also be effective to include two or more of these diamine residues in combination. For the resin film 1, it is preferable from the viewpoint of absorbance that aromatic diamine residues account for 30 mol % or more of all diamine residues in the resin film 1.

In the formula (2), $R^5$ represents a hydrogen atom or a monovalent organic group having 1 to 20 carbon atoms. Examples of the organic group having 1 to 20 carbon atoms include methyl group, ethyl group, propyl group, isopropyl group, butyl group, pentyl group, hexyl group, cyclohexyl group, octyl group, dodecyl group, and phenyl group. From the viewpoint of availability of raw materials for polymerization, the use of the methyl group or the ethyl group is preferable.

In the formulae (3) and (4), $R^6$ and $R^8$ each represent the residue of dicarboxylic acid, tricarboxylic acid or tetracarboxylic acid.

Examples of dicarboxylic acid residues include the residues of terephthalic acid, isophthalic acid, diphenyl ether dicarboxylic acid, bis(carboxyphenyl) hexafluoropropane, biphenyldicarboxylic acid, benzophenonedicarboxylic acid, and triphenyldicarboxylic acid, and examples of tricarboxylic acid residues include the residues of trimellitic acid, trimesic acid, diphenyl ether tricarboxylic acid, and biphenyltricarboxylic acid. Examples of tetracarboxylic acid residues are the same as those listed above for $R^1$ and $R^3$. Two or more of these may be used in combination.

In the formulae (3) and (4), $R^7$ and $R^9(OH)_2$ each represent a bisaminophenol derivative residue. Specific examples of such a bisaminophenol derivative residue include, but not limited to, the residues of 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl) propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, and 2,2-bis(4-amino-3-hydroxyphenyl)-1,1,1,3,3,3-hexafluoropropane, and these compounds may be used either singly or as a combination of two or more thereof.

In addition, it is preferable to cap the chain end of the resins represented by the formulae (1) to (4) with a monoamine having an acid group, an anhydride, an acid chloride, or a monocarboxylic acid, because this can provide resins having acid groups at the ends of the backbone chains.

Preferable examples of such a monoamine include 2-aminophenol, 3-aminophenol, and 4-aminophenol. Two or more of these may be used in combination.

Preferable examples of such an anhydride, acid chloride, and monocarboxylic acid include generally known ones such as phthalic anhydride, maleic anhydride, and nadic anhydride. Di-tert-butyl dicarbonate is also preferably used as a reactive chain end. Two or more of these may be used in combination.

For the laminate according to the present invention, it is preferable for the resin contained in the resin film 2 to include one or more structures selected from the group consisting of a dimethylsiloxane structure as represented by the formula (5), a diphenylsiloxane structure as represented by the formula (6), an alkylene glycol structure as represented by the formula (7), and an alkylene structure as represented by the formula (8).

[Chemical compound 2]

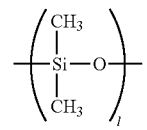

(5)

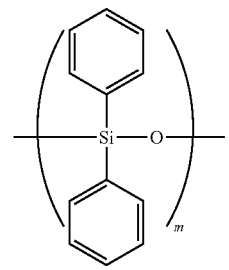

(6)

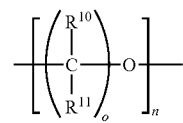

(7)

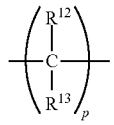

(8)

In the formulae (5) to (8), $R^{10}$ to $R^{13}$ each independently represent a hydrogen atom or a monovalent organic group having 1 to 20 carbon atoms. Here, l, m, and n each independently represent an integer of 4 to 40; p represents an integer of 10 to 40; and o represents an integer of 1 to 16.

If a structure as represented by any of the formulae (5) to (8) is included in the structure of the resin, this is preferable because it serves to improve the flexibility and adhesive strength of the resin film 2. $R^{10}$ to $R^{13}$ are as described in the explanation of $R^5$.

For aliphatic diamine residues, specific examples of such structures include diamine residues containing polyethylene oxide groups such as the diamine residues of Jeffamine KH-511, Jeffamine ED-600, Jeffamine ED-900, Jeffamine ED-2003, Jeffamine EDR-148, and Jeffamine EDR-176, as well as D-200, D-400, D-2000, and D-4000, which are products of polyoxy propylene diamine (all trade names, manufactured by HUNTSMAN); and diamine residues containing polyalkylene oxide groups such as the residues of ELASMER 250P, ELASMER 650P, ELASMER 1000P, and Porea SL100A (all trade names, manufactured by Kumiai Chemical Industry Co., Ltd.). In addition, examples of siloxanediamine residues include the residues of propylamine-terminated siloxanediamines such as LP-7100, KF-8010, KF-8012, and X-22-161A (all trade names, manufactured by Shin-Etsu Chemical Co., Ltd.). Two or more of these diamine residues may be used in combination.

For the laminate according to the present invention, it is preferable for the resin contained in the resin film 2 to be polyimide siloxane. Polyimide siloxane is a resin having a siloxane structure in the repeating structure of polyimide, and the polyimide siloxane to use for the present invention preferably contains a siloxanediamine residue as represented by the formula (9) in its structure.

[Chemical compound 3]

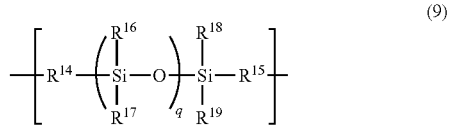

(9)

In the formula (9), q is a natural number of 1 to 50. $R^{14}$ and $R^{15}$ may be identical to or different from each other and they each represent an alkylene group containing 1 to 30 carbon atoms or a phenylene group. $R^{16}$ to $R^{19}$ may be identical to or different from each other and they each represent an alkyl group containing 1 to 30 carbon atoms, a phenyl group, or a phenoxy group.

Examples of siloxanediamine residues as represented by the formula (9) include residues of α,ω-bis(3-aminopropyl) polydimethyl siloxane, α,ω-bis(3-aminopropyl)polydiethyl siloxane, α,ω-bis(3-aminopropyl)polydipropyl siloxane, α,ω-bis(3-aminopropyl)polydibutyl siloxane, α,ω-bis(3-aminopropyl)polydiphenoxy siloxane, α,ω-bis(2-aminoethyl)polydimethyl siloxane, α,ω-bis(2-aminoethyl)polydiphenoxy siloxane, α,ω-bis(4-aminobutyl)polydimethyl siloxane, α,ω-bis(4-aminobutyl)polydiphenoxy siloxane, α,ω-bis(5-aminopentyl)polydimethyls iloxane, α,ω-bis(5-aminopentyl)polydiphenoxy siloxane, α,ω-bis(4-aminophenyl)polydimethyl siloxane, and α,ω-bis(4-aminophenyl) polydiphenoxy siloxane. The siloxane diamines listed above may be used singly or as a combination of two or more thereof.

For the laminate according to the present invention, the resin film 2 preferably has a 1% weight loss temperature of 300° C. or more. Here, the 1% weight loss temperature of the resin film 2 is determined by heating the resin film 2 at 250° C. for 30 minutes. Even if heat treatment of the resin film 2 has already been finished, this can be determined from a specimen heat-treated at 250° C. for 30 minutes. If the 1% weight loss temperature is 300° C. or more, it means that the entire resin film 2 can be prevented from being degraded due to heat generated by laser beam irradiation, and this serves to avoid the generation of debris due to degradation of the resin film 2. To ensure a 1% weight loss temperature of 300° C. or more, it is preferable for the resin film 2 to contain a component with high thermal stability. Specific examples of such components with high thermal stability include rigid components such as aromatic rings, siloxanes having relatively high thermal stability among other flexible structures, and combinations thereof. A 1% weight loss temperature of 300° C. or more can be achieved by preparing the resin film 2 using a resin in which monomer residues with relatively high thermal stability as mentioned above account for 50% or more of all monomer residues, which account for 100 mol %, present therein. From the viewpoint of versatility of polymers, it is preferable for the 1% weight loss temperature to be 600° C. or less.

Next, the production method for the laminate according to the present invention is described below.

The laminate 1 can be produced by forming a resin film 1 and a resin film 2 in this order on a substrate 1 with laser transparency. A typical procedure of the production method for the laminate 1 is described below. A varnish prepared by dissolving the components for a resin film 1 in a solvent is spread over a substrate 1 with laser transparency, and then it is heat-cured to produce a resin film 1. Further, a varnish prepared for a resin film 2 is spread over the resin film 1 in the same manner, and then the substrate is heat-cured to form a resin film 2. When producing the resin films 1 and 2 by the coating method, any appropriate coating technique may be adopted, such as rotary coating using a spinner, spray coating, roll coating, and slit die coating. After coating, it is preferable to dry the resin films 1 and 2 using a hot plate, a drying oven, infrared rays, etc., at a temperature of 50° C. to 150° C. for 1 minute to several tens of minutes. Then, if necessary, it is further heat-cured at a temperature of 100° C. to 500° C. for several minutes to several hours.

For the resin film 1, an appropriate film thickness is adopted in the range of 0.1 μm to 25 μm. For the resin film 2, furthermore, an appropriate film thickness is adopted in the range of 0.2 μm to 27 μm. The film thickness can be measured by a scanning electron microscope, optical film thickness measuring device, step profiler, etc.

Another layer may be provided between the substrate 1 with laser transparency and the resin film 1 and between the resin film 1 and the resin film 2. When another layer is to be provided between the substrate 1 with laser transparency and the resin film 1, it is formed first on the substrate 1 with laser transparency before forming the resin film 1. On the other hand, when another layer is to be provided between the resin film 1 and the resin film 2, the resin film 1 may be formed first, followed by forming such another layer and finally the resin film 2.

Next, a typical procedure for laying semiconductor elements on the laminate 1 to produce a laminate 2 is described below.

Figure 2:
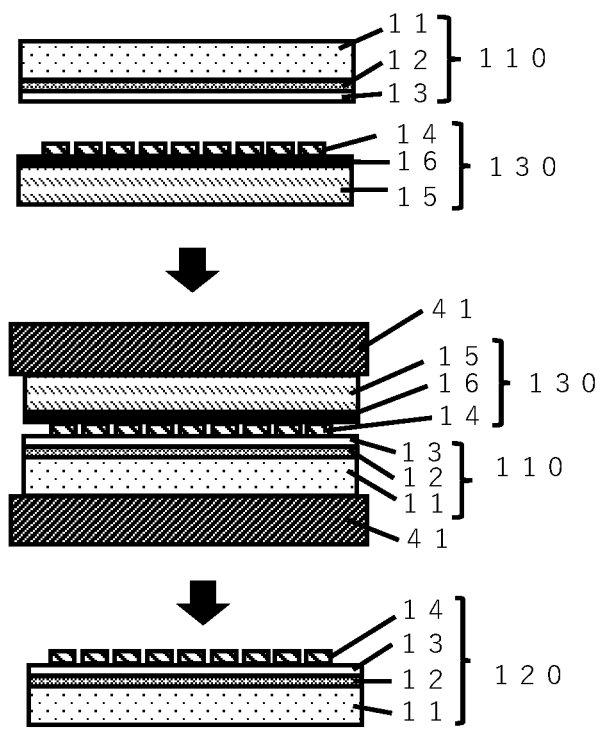
FIG. 2 This is a diagram illustrating a method for producing a laminate 2 using an adhesive for temporary bonding.
Figure 3:
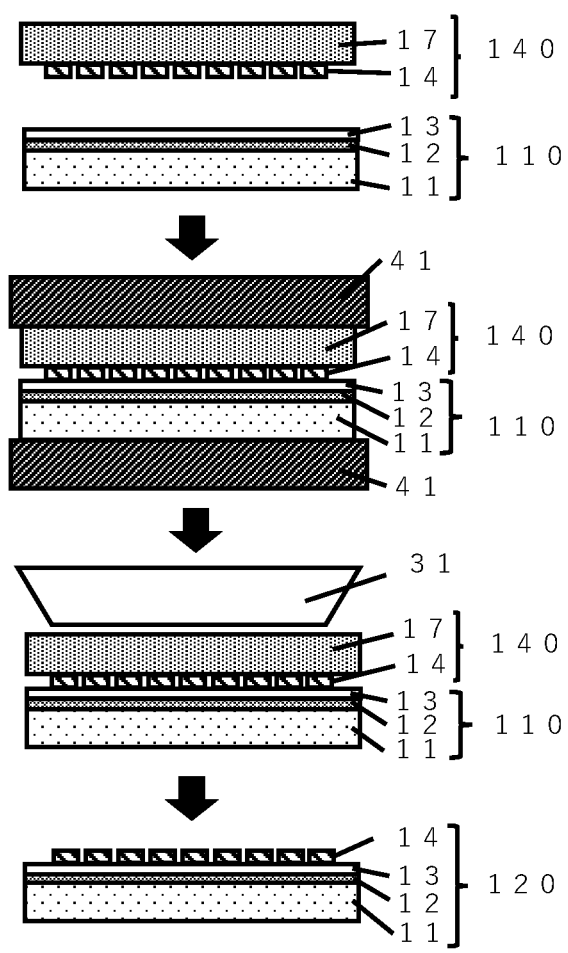
FIG. 3 This is a diagram illustrating a method for producing a laminate 2 by the laser lift-off technique.

FIG. 1 shows a procedure for forming a laminate 2 (120). First, a resin film 1 (12) and a resin film 2 (13) are formed in this order on a substrate 1 (11) with laser transparency to produce a laminate 1 (110), and then semiconductor elements (14) are arranged directly on the resin film 2 (13), followed by performing press bonding using a pressure device (41) such as vacuum laminator, wafer bonder, and press machine to provide a layered body. In another procedure that is illustrated in FIG. 2, semiconductor elements (14) are temporary bonded to a support body (15) with a temporary adhesive (16) to prepare a substrate (130) carrying temporary bonded semiconductor elements, and it is combined with the laminate 1 (110) in such a manner that the semiconductor elements (14) on the temporary adhesive (16) come in contact with the surface of the resin film 2 (13), followed by performing press bonding using a pressure device (41) as described above. Subsequently, the temporary adhesive (16) and the support body (15) are removed to produce a laminate 2 (120). In addition, as illustrated in FIG. 3, semiconductor elements (13) are laid directly on a crystal growth substrate (17) such as sapphire to prepare a semiconductor element-carrying substrate (140), and then it is combined with the laminate 1 (110) in such a manner that the semiconductor elements (14) come in contact with the resin film 2 (13), followed by press bonding using a pressure device (41) as described above. Subsequently, a laser beam (31) is applied through the crystal growth substrate (17) for laser lift-off to remove the semiconductor element (14) from the crystal growth substrate (17) to the laminate (110) side. The optimum pressure used for laying the semiconductor elements depends on the adhesive strength of the resin film 2, and an appropriate value is set in the range of 0.05 MPa to 5.0 MPa. It is preferable to adopt a value of 2.0 MPa or less in order to avoid damage to the semiconductor elements and prevent them from being embedded in the resin film 2. Furthermore, when laying the semiconductor elements, the layers may be heated, as required, while applying a pressure. If they are heated, the elastic modulus of the resin film 2 will decrease to allow the semiconductor elements to be press-bonded at a lower pressure.

In addition, if alignment marks are made on the laminate in advance, they serve to facilitate transfer position adjustment in subsequent operations.

Figure 4:
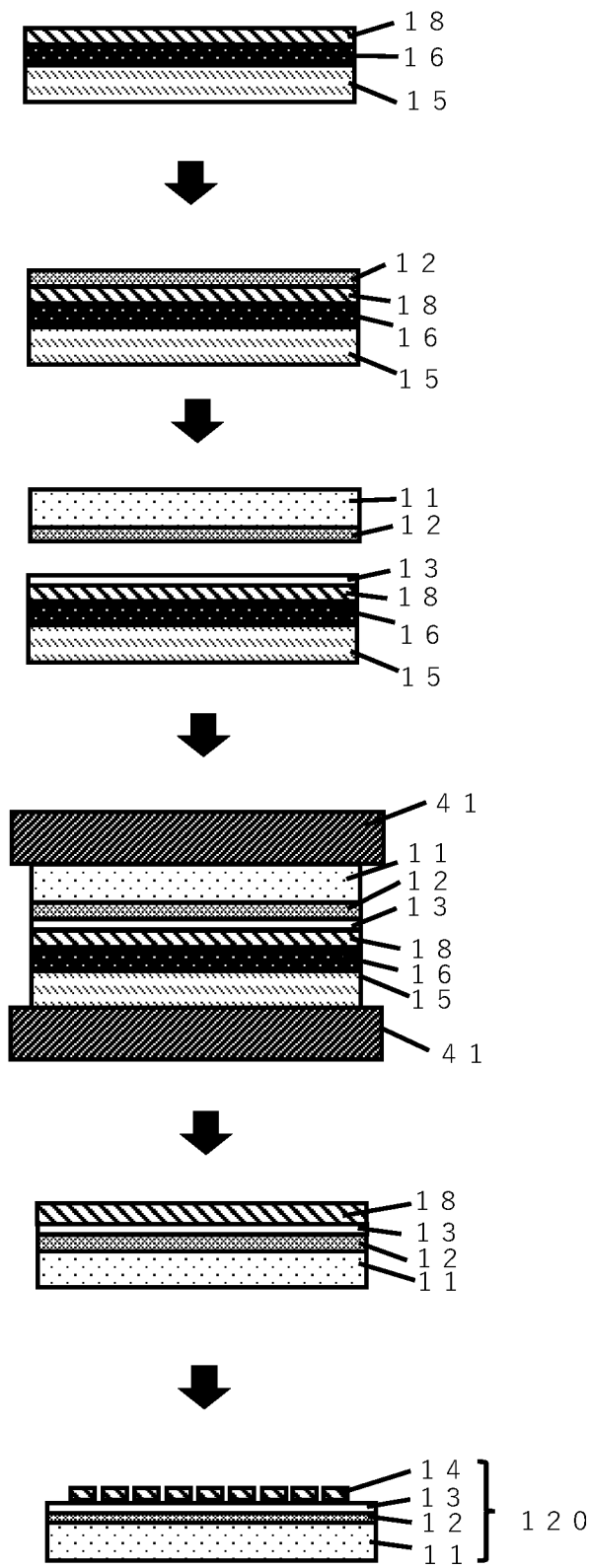
FIG. 4 This is a diagram illustrating another method for producing a laminate 2 using a semiconductor substrate.

A still another procedure for producing a laminate 2 is explained below with reference to FIG. 4. On another support body (15), a semiconductor substrate (18) in an undiced state is bonded with a temporary adhesive (16). Furthermore, a varnish prepared to form a resin film 2 is spread over the semiconductor substrate (18) in an undiced state and it is heat-cured to form a resin film 2 (13). In addition, a resin film 1 (12) is formed on a substrate (11) with laser transparency. They are combined in such a manner that the resin film 1 (12) on the laser-transmissive substrate (11) with laser transparency faces the resin film 2 (13) on the semiconductor substrate (18) and press-bonded by the aforementioned device (41). The support body (15) and the temporary adhesive (16) are then peeled and removed, and the semiconductor substrate (18) is diced into semiconductor elements (14) to produce a laminate 2 (120).

Described next is the production method for a semiconductor device.

The production method for a semiconductor device according to the present invention provides a process for producing a semiconductor device using the laminate 2 described above, and this semiconductor device production process includes a step for disposing the laminate 2 so that its semiconductor element plane faces a substrate 2 and a subsequent step for applying a laser beam through the substrate 1 with laser transparency present in the laminate 2 to transfer a semiconductor element to the substrate 2.

The step for disposing the laminate 2 so that its semiconductor element plane faces a substrate 2 is described below with reference to a diagram.

Figure 5:
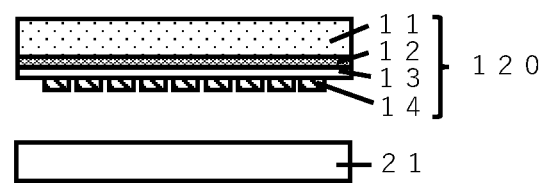
FIG. 5 This is a diagram illustrating the step for disposing a laminate 2 in such a manner that the semiconductor element plane thereof faces a substrate 2 in carrying out a method for producing a semiconductor device.

FIG. 5 shows a procedure for producing a semiconductor device. The semiconductor element plane refers to one of the surfaces of the laminate 2 (120) that has semiconductor elements (14).

The laminate 2 (120), which is produced by the procedure described above, is placed so that the semiconductor element plane faces the substrate 2 (21), wherein the laminate 2 (120) and the substrate 2 (21) are in parallel to each other. To prevent misalignment of semiconductor elements (14) due to their own weight during their transfer, the laminate 2 (120) and the substrate 2 (21) that face each other are disposed in such a manner that the laminate 2 (120) is on top. The laminate 2 (120) and the substrate 2 (21) are disposed at a certain distance apart. The distance between the semiconductor element plane and the substrate 2 can be set appropriately in the range of several micrometers to several hundred micrometers depending on the size and thickness of the semiconductor elements.

Any type of appropriate substrate can be used as the substrate 2, such as glass substrate, resin substrate, metal substrate, and circuit board with wiring formed thereon. Furthermore, an adhesive layer may be added to hold the transferred semiconductor elements. For the adhesive layer, an appropriate adhesive material can be adopted, including polysiloxane resin, acrylic resin, polyester resin, ACF resin, conductive paste, and the resin film 2 used for the present invention. The adhesive layer may have a thickness in the range of 0.5 µm to 100 µm, and an appropriate value is adopted based on the size of the semiconductor elements and the distance between the semiconductor elements and the substrate 2.

In addition, alignment marks may also be made on the substrate 2 to help the alignment of transfer positions.

Next, the subsequent step for applying a laser beam through the substrate 1 with laser transparency in the laminate 2 to transfer a semiconductor element to the substrate 2 is described with reference to a diagram.

Figure 6:
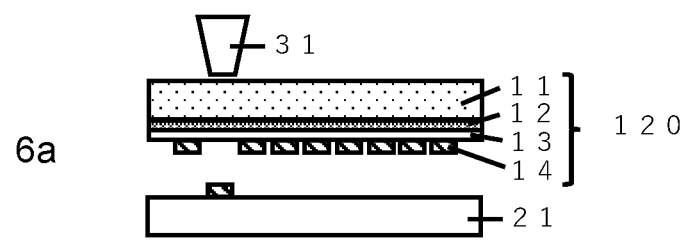
FIG. 6 This is a diagram illustrating the step for transferring a semiconductor element to a substrate 2 by applying a laser beam.
Figure 6:
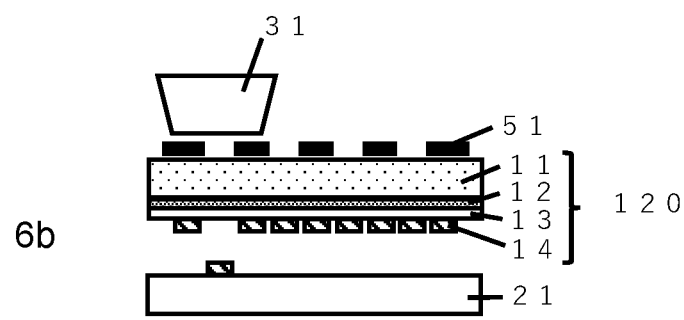

In FIG. 6, diagram 6a shows a typical step for chip transfer. After disposing the laminate 2 (120) and the substrate 2 (21), which are arranged according to the procedure described above, a laser beam (31) is emitted from outside the substrate 1 (11) with laser transparency present in the laminate 2 (120) so that the beam travels through the substrate 1 (11) with laser transparency to irradiate a semiconductor element (14). Examples of useful laser beams include solid state lasers such as YAG laser, $YVO_4$ laser, fiber laser, and semiconductor laser, and gas lasers such as $CO_2$ laser, excimer laser, and argon laser, from which an appropriate one may be selected depending on the wavelength to be used. The beam profile to use for irradiation is not particularly limited, and the spot size of the laser beam may be smaller than the size of the semiconductor elements. However, it should not be so large that the laser beam can hit a semiconductor element located adjacent to the semiconductor element being transferred. Furthermore, if the spot size of the laser beam is so large that it can hit a semiconductor element located adjacent to the semiconductor element being transferred, it may be good to provide a photomask (51) and apply a laser beam (31) through it as shown in FIG. 6b.

A laser beam of any appropriate energy density may be adopted. From the viewpoint of stability of the energy density of the laser beam in use, it is preferable to adopt a laser beam having an energy density of 1 $mJ/cm^2$ or more, and from the viewpoint of preventing damage to the semiconductor elements and shortening the processing time, its energy density is preferably 1,000 mJ/cm$^2$ or less. It is more preferable for the laser beam to have an energy density of 10 mJ/cm$^2$ or more and 500 mJ/cm$^2$ or less.

If the laminate 2 according to the present invention is used, it allows the transfer to be performed at a low energy, and even when the energy density of the laser beam is changed, its effects on positional accuracy and generation of debris and adhesive residue will be small. There can be variations in the output energy density of the laser beam used for irradiation, and therefore, in order to minimize the impact of output variations on the transferring performance, it is preferable for the laminate 2 to show a constant transferring performance regardless of the energy density of the laser beam. It is preferable that a constant transferring performance be ensured over a laser beam energy density range of 30 mJ/cm$^2$ or more, and particularly preferably over a range of 50 mJ/cm$^2$ or more from the viewpoint of practical application.

Furthermore, the substrate 2 may be heated when transferring the semiconductor elements. Particularly in the case where the substrate 2 has an adhesive layer, it serves to hold the transferred semiconductor elements more strongly. In the case of heating the substrate 2, the temperature is preferably 100° C. or less in order to prevent warping from being caused by heat from the substrate 2 to facilitate their transfer with high positional accuracy.

The step for transferring semiconductor elements is carried out while continuing positional adjustment to allow each semiconductor element to be disposed at the actual mounting position in the semiconductor device being produced. For example, when producing an LED substrate, LED elements are transferred while shifting the position at intervals depending on the pixel size of the LED and the arrangement of RGB colors. Then, the substrate 2 that carries transferred LED elements is placed so that it faces a circuit board, and they are press-bonded to the circuit board to produce a circuit board with LED elements mounted thereon. In the case where transfer is performed by means of the laminate according to the present invention, transfer can be achieved with high positional accuracy and accordingly, semiconductor elements can be transferred without misalignment from the circuit on the final board on which they are to be mounted, thereby reducing mounting failures attributable to positional misalignment.

In the production method for a semiconductor device according to the present invention, it is preferable for the aforementioned laser beam to have a wavelength of 248 nm, 266 nm, 308 nm, 355 nm, 532 nm, or 1,064 nm, and in particular, it is preferable to adopt a wavelength at which the resin film 1 shows an absorbance of 0.4 or more. The use of a laser beam as mentioned above serves to reduce damage to the semiconductor elements. It is more preferable for the aforementioned laser beam to have a wavelength of 248 nm, 266 nm, or 355 nm, which enables accurate transfer of very small semiconductor elements such as μLEDs. For laser beams of 248 nm, 266 nm, 308 nm, 355 nm, 532 nm, or 1,064 nm, it is particularly preferable to adopt an excimer laser, YAG laser, or IR laser.

Furthermore, when carrying out the production method for a semiconductor device according to the present invention, it is preferable for the substrate 2 to be a circuit board. If the substrate 2 is a circuit board, a substrate that carries transferred semiconductor elements can be converted directly into a semiconductor device. This eliminates the possibility of a positional misalignment caused by handling of the substrate after the chip transfer step, leading to an even higher positional accuracy. As such a circuit board, generally known ones such as TFT substrate and printed circuit board can be used.

The invention is described in more detail below with reference to examples.

EXAMPLES

The present invention will be described below with reference to examples, though the present invention is not limited to these examples. First, the evaluation procedures used in the examples and comparative examples are described.
(1) Preparation of Laminate A 4-inch glass substrate (manufactured by Corning Incorporated, Eagle XG, with an absorbance of 0.01 at 355 nm) having a thickness of 0.5 mm and provided with alignment marks or a 4-inch synthetic quartz substrate (manufactured by Daikoh Seisakusho, with an absorbance of 0.01 at 266 nm) having a thickness of 0.5 mm and provided with alignment marks was coated, using a spinner, with a varnish for resin film 1 that was prepared by the method described later, prebaked on a hot plate at 120° C. for 3 minutes, and then heat-cured at an appropriate temperature for an appropriate time to produce a resin film 1 on the glass substrate or the synthetic quartz substrate.

In addition, a varnish for resin film 2 that was prepared by the method described later was spread using a spinner in the same way, prebaked on a hot plate at 120° C. for 3 minutes, and then heat-cured at an appropriate temperature for an appropriate time to produce a laminate 1 in which the resin film 1 and the resin film 2 were stacked in this order on the glass substrate or the synthetic quartz substrate.

The film thicknesses of the resin film 1 and the resin film 2 were determined by fracturing the laminate and observing the cross section under a scanning electron microscope (manufactured by Hitachi High-Technologies Corporation, S-4800).

Elsewhere, a silicon wafer with a thickness of 100 μm was prepared by polishing its rear surface, and the silicon wafer was affixed to a dicing tape (manufactured by Denka Company Limited, UDC-1025MC), followed by cutting it into a size of 100 μm×200 μm with a dicing machine (manufactured by DISCO Corporation, DAD300) to produce dummy chips of semiconductor elements. The distance between the chips was 150 μm, and the number of the resulting dummy chips per unit area was 1,100 chips/cm$^2$.

A UV beam was applied to dicing tape to reduce its adhesiveness. One hundred dummy chips arrayed in a 10×10 grid were selected and the other ones surrounding them were removed with tweezers. The dummy chips on the dicing tape were overlaid onto the resin film 2 of the aforementioned laminate 1 in such a manner that the resin film faces the chip plane. Then, the dummy chips were press-bonded to the resin film 2 using a vacuum laminator. Subsequently, the dicing tape was peeled off to produce a laminate 2. The surfaces of the dummy chips laid on the resin film 2 were visually observed under an optical microscope to measure the number of chips laid on the resin film 2 and the number of chips free of damage. Results are given in Table 2 and Table 3.
(2) Measurement of Absorbance of Resin Film 1

A varnish for resin film 1 was spread on a quartz substrate in the same way as described in the section (1) above, prebaked, and heat-cured to produce a quartz substrate provided with a resin film 1 for measuring absorbance. The film thickness was also measured. The absorbance was measured continuously over the range from 200 nm to 1,100 nm using an ultraviolet-visible spectrophotometer (manufactured by Hitachi Ltd., U-2910). From the measurements, values at 248 nm, 266 nm, 308 nm, 355 nm, 532 nm, and 1,064 nm were selected and the absorbance per micrometer was calculated for each of them according to the equation given below.

Absorbance per µm=actual measured absorbance/
measured film thickness (µm)

(3) Measurement of Adhesive Strength of the Surface of Resin Film 2 Opposite to the One in Contact with Resin Film 1

(3)-1 Measurement of Adhesive Strength of the Surface of Resin Film 2 Opposite to the One in Contact with Resin Film 1 in Laminate 1

Using a vacuum laminator, Kapton film cut into a strip with a size of 1 cm×9 cm was press-bonded under 0.1 MPa at 25° C. to the surface of the resin film 2 opposite to the one in contact with the resin film 1 in a laminate 1 produced by the method described above. A sample was set in a tensile tester (manufactured by NIDEC-SHIMPO Corporation, FGS-VC), and the press-bonded Kapton film was peeled vertically at a constant speed of 2 mm/sec. In this test, the peel strength was measured with a digital force gauge (manufactured by NIDEC-SHIMPO Corporation, FGJN-5). Three measurements were taken from different samples and the average was adopted to represent their adhesive strength.

(3)-2 Measurement of Adhesive Strength of the Surface of Resin Film 2 Opposite to the One in Contact with Resin Film 1 in Laminate 2

A piece of dicing tape (UDC-1025MC) was adhered to the surface of a dummy chip formed on the resin film 2 of a laminate 2 produced by the method described above, and the dummy chip was peeled off by pulling the tape. A Kapton film was press-bonded in the same way as in the section (3)-1 to the surface of the resin film 2 deprived of the dummy chip, and then the adhesive strength was measured by the same technique as in the section (3)-1.

(4) Measurement of Indentation Hardness H1 and H2

The indentation hardnesses H1 and H2 were measured using a nanoindenter (manufactured by Hysitron, Triboindenter T1950).

In the case of a laminate 1, a sample for measurement was prepared by cutting the laminate 1 to a size of 10 mm×10 mm. In the case of a laminate 2, dummy chips were removed from the laminate by the same procedure as used for measuring the adhesive strength of the resin film 2 in the section (3) above to provide a sample having an exposed resin film 2, which was then cut to a size of 10 mm×10 mm.

The sample prepared was fixed to a dedicated sample mounting stage with an adhesive (manufactured by Toagosei Co., Ltd., Aron Alpha fast-acting versatile type), and measurement of the indentation hardness H2 was performed according to indentation loading/unloading test in which an indentation was made from the surface of the resin film 2 toward the resin film 1 in the sample using a Berkovich indenter (triangular pyramid diamond indenter) followed by removing the load.

For the measurement of the indentation hardness H1, first the semiconductor elements were removed from the laminate 2 by the method described above and the resin film 2 was removed by dry etching, followed by performing measurement with the surface of the resin film 1 exposed. Before performing the etching of the resin film 2, dry etching was performed at a site different from the intended measuring site and the etching rate of the resin film 2 was calculated. Then, the etching time required for the resin film 2 was calculated from the results and used for its etching. Subsequently, the components existing on the surface of the resin film were analyzed by ATR-IR (manufactured by BRUKER, INVENIO S). The completion of the removal of the resin film 2 was confirmed by the non-detection of the components of the resin film 2.

The sample deprived of the resin film 2 by the method described above was cut to a size of 10 mm×10 mm in the same way and measurement of the indentation hardness H1 was performed according to indentation loading/unloading test in which an indentation was made from the surface of the resin film 1 toward the substrate 1 with laser transparency followed by removing the load. The measuring conditions were as described below.

[Measuring Conditions]

Environment for measurement: 25±2° C., atmosphere

Measuring frequency: 100 Hz

Measuring method: continuous rigidity measurement method

Based on the resulting load-indentation depth curve, the indentation hardness H1 and the indentation hardness H2 were calculated from values in the indentation region where the underlying substrate had no influence.

(5) Measurement of Film Thickness

The thicknesses t1 (µm) and t2 (µm) were measured by fracturing the laminate 2 and observing the cross section under a scanning electron microscope (manufactured by Hitachi High-Technologies Corporation, S-4800).

(6) Measurement of Elongation at Break

Varnishes for resin films 1 and 2 were spread on a piece of copper foil using a bar coater, prebaked on a hot plate at 120° C. for 3 minutes, and then heat-cured at a specified temperature for a specified time period given in Table 2 described later to produce a resin film 1 with a thickness of 10 µm on the copper foil. Then, the copper foil in the resulting copper foil based laminate containing the resin films 1 and 2 was completely etched with a ferric chloride solution to produce single layers of the resin films 1 and 2. The resulting single layer films were cut into a strip shape with a width of 1.5 cm and a length of 2 cm to provide samples for elongation measurement. Using a Tensilon RTM-100 (manufactured by Orientec Co., Ltd.), measurement of elongation at break at room temperature of 23° C. was performed by pulling a test piece at a tension speed of 50 mm/min in an atmosphere at room temperature of 23° C. and a relative humidity of 45.0% RH. Ten strip-shaped test pieces were prepared from each sample. Then, the five largest values were selected from the test results and their average was calculated.

(7) Measurement of Heat Decomposition Temperature

A single layer resin film 2 used for the measurement of elongation at break was first heat-treated at 250° C. for 30 minutes, and a specimen of about 15 mg was packed in an aluminum standard container and subjected to measurement using a thermogravimetric analyzer (manufactured by Shimadzu Corporation, TGA-50). In regard to the measuring conditions, the specimen was maintained at 120° C. for 30 minutes and heated to 500° C. at a heating rate of 5° C./min. From the resulting weight loss curve, the temperature at which the weight loss reached 1% was identified and this temperature was adopted as the 1% weight loss temperature.

(8) Semiconductor Chip Transfer Test (8)-1 Production of Opposite Substrate for Chip Transfer Polydimethylsiloxane was diluted with toluene to prepare a diluted solution having a ratio by weight adjusted to 1:9 between polydimethylsiloxane and toluene and it was applied using a spinner over a 4-inch non-alkali glass substrate with a thickness of 0.5 mm (manufactured by Corning, EAGLE XG) that was provided with alignment marks and heat-cured on a hot plate at 120° C. for 3 minutes to form an adhesive layer on the glass substrate. The thickness of the heat-cured adhesive layer was measured using an optical film thickness meter (manufactured by Dainippon Screen Mfg. Co., Ltd., Lambda Ace, refractive index 1.543), and an opposite substrate having an adhesive layer with a thickness of 20 μm was produced.

(8)-2 Transfer of Semiconductor Element

Next, a laser beam source, the laminate 2 produced by the method described above, and the opposite substrate were disposed in this order. Here, the surface of the laminate carrying the dummy chips and the surface of the opposite substrate having the adhesive layer were held so that they faced each with a distance of 50 μm maintained between the surface of the dummy chips and the surface of the adhesive layer. The laminate and the opposite substrate were aligned by means of their respective alignment marks. The spot size of the laser beam was adjusted by means of the slit to a rectangular shape of 120 μm×220 μm, and the positions of the laser beam source and the laminate were adjusted so that one dummy chip comes to the center of the laser beam spot while preventing the laser beam from hitting adjacent dummy chips.

A laser beam having a wavelength of 248 nm, 266 nm, 208 nm, 355 nm, 536 nm, or 1,064 nm was applied to the dummy chip located at the laser beam irradiation position, and laser beam irradiation was repeated with the energy density changed by 50 mJ/cm² each time over the range from 150 mJ/cm² to 400 mJ/cm². The transfer test was conducted for three dummy chips at each energy density.

(8)-3 Evaluation for Transfer Property

The opposite substrate was observed after the laser beam irradiation in order to determine how many of the three dummy chips had been transferred to the substrate 2. In addition, the dummy chips transferred to the opposite substrate were examined under a microscope and the sample was rated as "chip undamaged" if no chip was damaged at any laser energy density or rated as "chip damaged" if any of the chips was found to be broken, chipped, or cracked.

(8)-4 Evaluation for Positional Accuracy

The position of the semiconductor elements on the opposite substrate after the transfer test was calculated from the alignment mark on the opposite substrate, and it was compared with the position of the laminate 2. Of the three chips subjected to transfer test at each energy density, the one suffering the largest positional misalignment was examined and the positional accuracy was evaluated as described below. The sample was rated as A for positional accuracy if the positional misalignment was less than ±5 μm in the X-axis direction and less than ±5 μm in the Y-axis direction, rated as C for positional accuracy if it was more than ±10 μm in the X-axis direction or more than ±10 μm in the Y-axis direction, or rated as B for positional accuracy if the misalignment was in between.

(8)-5 Evaluation for Adhesive Residue

After the laser beam irradiation, the transferred chips that were still in an unwashed state were observed under an optical microscope. In the surface of the dummy chips that was in contact with the resin film 2, the area covered by adhesive residue from either the resin film 1 or the resin film 2 was determined. Relative to the area of the contact surface per chip with the resin film 2, which accounts for 100%, the average area covered by adhesive residue on the contact surface with the resin film 2 was calculated for each chip that was transferred successfully at each energy density. Based on the results obtained, the sample was rated as A if the average area covered by adhesive residue accounted for 0% or more and less than 1%, rated as B if it accounted for 1% or more and less than 30%, and rated as C if it accounted for 30% or more.

(8)-6 Evaluation for Debris

After the laser beam irradiation, the opposite substrate that was still in an unwashed state was observed under an optical microscope to identify foreign objects of 1 μm or more existing around the transferred dummy chips on the adhesive layer surface. At each energy density, the average number of chips that were transferred successfully was calculated, and the sample was rated as A for debris if it was less than 10, rated as B for debris if it was 10 or more and less than 50, or rated as C for debris if it was 50 or more. If debris larger than 50 μm was contained, the sample was rated as C regardless of the number of debris objects.

(8)-7 Evaluation for Process Margin

Of the samples in which three dummy chips were transferred successfully to the substrate 2, those which were free of chip damage and were rated as A or B for positional accuracy in transfer, adhesive residue, and debris in the chip transfer test for the evaluations from (8)-3 to (8)-6 described above were considered to have good transfer properties at the relevant energy density, and they were examined to determine the energy density range over which chips were transferred successfully. A sample was rated as A for process margin if the energy range was 100 mJ/cm² or more, rated as B for process margin if it was 50 mJ/cm² or more and less than 100 mJ/cm², and rated as C for process margin if it was less than 50 mJ/cm².

(9) Method of Measuring Solid Content in Resin Solution

From a resin solution prepared by the procedure described later, about 1 g was weighed in an aluminum cup, heated on a hot plate at 120° C. for 3 minutes, then heated up to 250° C., and, after reaching 250° C., maintained there for 30 minutes. The weight of the resin remaining after heating was measured, and the solid content was calculated by the formula given below. Solid content (wt %)=weight of resin after heating (g)/weight of resin solution before heating (g)×100

The abbreviations used in the production examples given below refer to the following dianhydrides, diamines, additives, and solvents.

PMDA: pyromellitic dianhydride (manufactured by Daicel Corporation)

BPDA: 3,3',4,4'-biphenyltetracarboxylic dianhydride (manufactured by Mitsubishi Chemical Corporation)

BTDA: 3,3',4,4'-benzophenone tetracarboxylic dianhydride (manufactured by FUJIFILM Wako Pure Chemical Corporation)

DIBOC: di-tert-butyl dicarbonate (manufactured by Tokyo Chemical Industry Co., Ltd.) PA: phthalic anhydride (manufactured by Tokyo Chemical Industry Co., Ltd.)

PDA: p-phenylene diamine (manufactured by Tokyo Chemical Industry Co., Ltd.)

BAHF: 4,4'-dihydroxy-3,3'-diaminophenyl hexafluoropropane (manufactured by Merck)

APPS2: α,ω-bis(3-aminopropyl)polydimethyl siloxane (average molecular weight 860, q=9 (average)) (manufactured by Shin-Etsu Chemical Co., Ltd.)

APPS3: α,ω-bis(3-aminopropyl)polydimethyl siloxane (average molecular weight 1,600, q=19 (average)) (manufactured by Shin-Etsu Chemical Co., Ltd.)

NMP: 2-methyl-1-pyrrolidone (manufactured by Mitsubishi Chemical Corporation)

DMIB: N,N-dimethylisobutyl amide (manufactured by Mitsubishi Chemical Corporation)

CHN: cyclohexanone (manufactured by Toyo Gosei Co., Ltd.)

TPX1291: carbon black (manufactured by CABOT)

BYK21116: polymer dispersing agent (manufactured by BYK-Chemie)

JER871: dimer acid modified epoxy resin (manufactured by Mitsubishi Chemical Corporation)

PETG: pentaerythritol based backbone epoxy resin (manufactured by Showa Denko K.K.)

2E4MZ: 2-ethyl-4methyl imidazole (manufactured by Shikoku Chemicals Corporation)

100LM: crosslinking agent having alkoxymethyl group as represented by the structural formula given below (manufactured by Sanwa Chemical Co., Ltd.)

[Chemical compound 4]

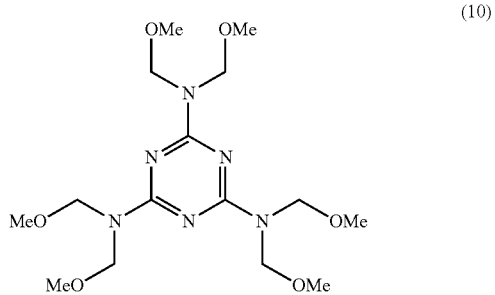

(10)

Production Example 1 (Polymerization of Resin to Include in Resin Film 1)

A reaction vessel equipped with a thermometer, a dry nitrogen inlet, a heating/cooling device using hot water/cooling water, and a stirring device was set up, and 11.82 g (0.109 mol) of PDA and 195.8 g of DMIB were fed together and dissolved. In this liquid, a mixed solution of 0.48 g (2.19 mmol) of DIBOC and 26.1 g of DMIB was dropped while stirring, and stirred at 40° C. for 1 hour. Next, 12.87 g (0.437 mol) of BPDA and 13.05 g of DMIB were added and stirred at 60° C. for 30 minutes. Then, 13.83 g (0.063 mol) of PMDA and 13.05 g of DMIB were added and stirred at 60° C. for 4 hours to prepare a polyimide precursor PAA-1 solution with a 13 wt % solid content. In PAA-1, monomer residues having an aromatic ring structure account for 99.5 mol % of all monomer residues, which account for 100 mol %. PAA-1 is a resin having a structure as represented by the formula (2).

Production Example 2 (Polymerization of Resin to Include in Resin Film 1)

A reaction vessel equipped with a thermometer, a dry nitrogen inlet, a heating/cooling device using hot water/cooling water, and a stirring device was set up, and 127.5 g (0.150 mol) of APPS2 and 866 g of NMP were fed together at 40° C. and dissolved. In this liquid, 37.85 g (0.350 mol) of PDA and 113.5 g of NMP were added and dissolved. Next, 73.56 g (0.250 mol) of BPDA and 95.06 g (0.295 mol) of BTDA were added along with 223.5 g of NMP. The mixture was reacted at 60° C. for 4 hours to prepare a polyimide precursor PAA-2 solution with a 25 wt % solid content. In PAA-2, monomer residues having an aromatic ring structure account for 85 mol % of all monomer residues, which account for 100 mol %. PAA-2 is a resin having a structure as represented by the formula (2) and the formula (5).

Production Example 3 (Polymerization of Resin to Include in Resin Film 2)

A reaction vessel equipped with a thermometer, a dry nitrogen inlet, a heating/cooling device using hot water/cooling water, and a stirring device was set up, and 344.0 g (0.40 mol) of APPS2, 37.50 g (0.025 mol) of APPS3, and 27.47 g (0.075 mol) of BAHF were fed along with 481.4 g of CHN and dissolved, followed by adding 14.81 g (0.10 mol) of PA and 20.00 g of CHN and stirring at 60° C. for 15 minutes. Then, 97.61 g (0.45 mol) of PMDA and 20.00 g of CHN were added, stirred at 60° C. for 1 hour, heated up to 145° C., and allowed to react for 4 hours to prepare a polyimide siloxane PIS-1 solution with a 50 wt % solid content. In PIS-1, monomer residues having a flexible structure account for 43 mol % of all monomer residues, which account for 100 mol %. PIS-1 is a resin having a structure as represented by the formula (1) and the formula (5).

Production Example 4 (Polymerization of Resin to Include in Resin Film 2)

A reaction vessel equipped with a thermometer, a dry nitrogen inlet, a heating/cooling device using hot water/cooling water, and a stirring device was set up, and 254.56 g (0.296 mol) of APPS2, 28.68 g (0.019 mol) of APPS3, and 20.33 g (0.056 mol) of BAHF were fed along with 310.56 g of CHN and dissolved, followed by adding 16.44 g (0.111 mol) of PA and 38.82 g of CHN and stirring at 60° C. for 15 minutes. Then, 68.20 g (0.312 mol) of PMDA and 38.82 g of CHN were added, stirred at 60° C. for 1 hour, heated up to 145° C., and allowed to react for 4 hours to prepare a polyimide siloxane PIS-2 solution with a 50 wt % solid content. In PIS-2, monomer residues having a flexible structure account for 40 mol % of all monomer residues, which account for 100 mol %. PIS-2 is a resin having a structure as represented by the formula (1) and the formula (5).

Production Example 5 (Polymerization of Resin to Include in Resin Film 2)

A reaction vessel equipped with a thermometer, a dry nitrogen inlet, a heating/cooling device using hot water/cooling water, and a stirring device was set up, and 39.04 g (0.033 mol) of ELASMER 650P and 131.69 g of NMP were fed together at 40° C. and dissolved. In this liquid, 8.25 g (0.076 mol) of PDA and 16.42 g of NMP were added and dissolved. Next, 15.87 g (0.054 mol) of BPDA and 17.39 g (0.054 mol) of BTDA were added along with 16.42 g of NMP. The mixture was reacted at 60° C. for 4 hours to prepare a polyimide precursor PAA-3 solution with a 30 wt % solid content. In PAA-3, monomer residues having an aromatic ring structure account for 84.9 mol % of all monomer residues, which account for 100 mol %. PAA-3 is a resin having a structure as represented by the formula (2) and the formula (7).

Production Example 6 (Preparation of Carbon Black Dispersion Liquid to Include in Resin Film 1)

A copolymer of methyl methacrylate, a methacrylic acid, and styrene (weight ratio 30/40/30) was synthesized according to a method described in literature (Japanese Patent No. 3120476), and 40 parts by weight of glycidyl methacrylate was added, then reprecipitated with purified water, filtered, and dried to prepare an acrylic polymer (P-1) powder with an average molecular weight (Mw) of 40,000 and an acid value of 110 (mgKOH/g). In a tank, 400 g of TPX1291, 187.5 g of a 40 wt % solution of propylene glycol monomethyl ether acetate of the acrylic resin (P-1), a polymer dispersing agent (BYK21116, manufactured by BYK-Chemie, 62.5 g), and propylene glycol monoethyl ether acetate (890 g) were fed and stirred for 1 hour with a homomixer (manufactured by Tokushu Kika Kogyo Co., Ltd.) to provide a preliminary dispersion liquid 1. Then, a preliminary dispersion liquid 2 was fed to an Ultra Apex Mill (manufactured by Kotobuki Industry Co., Ltd.) equipped with a centrifugal separator that was 70% filled with zirconia beads with a diameter of 0.10 mm (manufactured by Toray Industries, Inc.) and they were dispersed at a rotation speed of 8 m/s for 2 hours to provide a carbon black pigment dispersion liquid Bk-1 having a solid content of 25 wt % and a pigment/resin ratio (by weight) of 80/20.

Examples 1 to 23 and Comparative Examples 1 and 2

Resin solutions prepared as described in Production examples 1 to 5 were mixed with the carbon black dispersion liquid prepared in Production example 6, additives, and solvents were mixed as specified in Table 1 and stirred to produce varnishes for resin film 1 and resin film 2. The varnishes were filtered through a 0.2 μm PTFE filter. Using these varnishes, laminates were produced according to the procedures described above. Details and various evaluation results of the resulting laminates are summarized in Tables 2 to 5.

TABLE 1

| purpose | name of varnish | resin solution type weight | specific structure contained in resin | additive type weight | type weight | type weight | solvent type weight |
|---|---|---|---|---|---|---|---|
| formation of resin film 1 | varnish 1-1 | PAA-1 3.85 g | Equation (2) | — | — | — | NMP 6.15 g |
| | varnish 1-2 | PAA-2 6.00 g | Equation (2) Equation (5) | — | — | — | NMP 4.00 g |
| | varnish 1-3 | PAA-2 10.00 g | Equation (2) Equation (5) | — | — | — | — |
| | varnish 1-4 | PAA-1 6.73 g | Equation (2) | Bk-1 0.50 g | — | — | NMP 2.77 g |
| formation of resin film 2 | varnish 2-1 | PIS-1 3.28 g | Equation (1) Equation (5) | JER871 0.33 g | 100LM 0.02 g | 2E4MZ 0.02 g | CHN 6.36 g |
| | varnish 2-2 | PIS-2 3.58 g | Equation (1) Equation (5) | JER871 0.18 g | 100LM 0.02 g | 2E4MZ 0.02 g | CHN 6.21 g |
| | varnish 2-3 | PIS-2 7.14 g | Equation (1) Equation (5) | JER871 0.36 g | 100LM 0.04 g | 2E4MZ 0.04 g | CHN 2.43 g |
| | varnish 2-4 | PIS-2 7.14 g | Equation (1) Equation (5) | PETG 0.36 g | 100LM 0.04 g | 2E4MZ 0.04 g | CHN 2.43 g |
| | varnish 2-5 | PIS-2 6.84 g | Equation (1) Equation (5) | PETG 0.51 g | 100LM 0.03 g | 2E4MZ 0.03 g | CHN 2.58 g |
| | varnish 2-6 | PIS-2 8.00 g | Equation (1) Equation (5) | — | — | — | CHN 2.00 g |
| | varnish 2-7 | PAA-3 5.00 g | Equation (2) Equation (7) | — | — | — | NMP 5.00 g |
| | varnish 2-8 | PAA-3 5.00 g | Equation (2) Equation (7) | — | — | — | NMP 5.00 g |

TABLE 2-1

| | | | Example 1 | Example 2 | Example 3 | Example 4 | Example 5 | Example 6 |
|---|---|---|---|---|---|---|---|---|
| laser-transparent substrate 1 | type | — | non-alkali glass | non-alkali glass | non-alkali glass | non-alkali glass | non-alkali glass | non-alkali glass |
| properties of resin film 1 | varnish | — | varnish 1-2 | varnish 1-2 | varnish 1-1 | varnish 1-3 | varnish 1-2 | varnish 1-3 |
| | film production conditions | °C./min | 180/30 | 180/30 | 180/30 | 180/30 | 180/30 | 180/30 |
| | absorbance at 248/μm | — | 2.45 | 2.45 | 4.53 | 2.45 | 2.45 | 2.45 |
| | absorbance at 266/μm | — | 2.09 | 2.09 | 4.79 | 2.09 | 2.09 | 2.09 |
| | absorbance at 308/μm | — | 2.61 | 2.61 | 3.59 | 2.61 | 2.61 | 2.61 |
| | absorbance at 355/μm | — | 1.68 | 1.68 | 1.90 | 1.68 | 1.68 | 1.68 |
| | absorbance at 532/μm | — | 0.00 | 0.00 | 0.05 | 0.00 | 0.00 | 0.00 |
| | absorbance at 1,064/μm | — | 0.00 | 0.00 | 0.03 | 0.00 | 0.00 | 0.00 |
| | elongation at break | % | 1.5 | 1.5 | 1.8 | 1.5 | 1.5 | 1.5 |
| | t1 | μm | 2.0 | 2.0 | 30.0 | 30.0 | 0.3 | 10.0 |

TABLE 2-1-continued

|  |  |  | Example 1 | Example 2 | Example 3 | Example 4 | Example 5 | Example 6 |
|---|---|---|---|---|---|---|---|---|
| properties of resin film 2 | varnish | — | varnish 2-4 | varnish 2-3 | varnish 2-2 | varnish 2-2 | varnish 2-2 | varnish 2-3 |
|  | film production conditions | °C./min | 180/10 | 180/10 | 18.0 | 180/10 | 180/10 | 180/10 |
|  | elongation at break | % | 1,050 | 1,200 | 1,200 | 1,200 | 1,200 | 1,200 |
|  | t2 | μm | 30 | 30 | 0.5 | 5.0 | 1.0 | 15 |
|  | 1% weight loss temperature | °C. | 287 | 285 | 285 | 285 | 285 | 285 |
| properties of laminate | adhesive strength of surface of resin film 2 opposite to the one in contact with resin film 1 in laminate 1 | N/cm | 0.03 | 0.28 | 0.06 | 0.07 | 0.07 | 0.09 |
|  | adhesive strength of surface of resin film 2 opposite to the one in contact with resin film 1 in laminate 2 | N/cm | 0.03 | 0.28 | 0.06 | 0.07 | 0.07 | 0.09 |
|  | indentation hardness H1 | MPa | 3.8 | 3.8 | 330 | 3.8 | 3.8 | 3.8 |
|  | indentation hardness H2 | MPa | 1.8 | 1.4 | 290 | 2.0 | 2.6 | 2.1 |
|  | H1 > H2 satisfied |  | yes | yes | yes | yes | yes | yes |
|  | (t1 + t2) | μm | 32 | 32 | 31 | 35 | 1.3 | 25 |
|  | t1/t2 | — | 0.07 | 0.07 | 60 | 6.0 | 0.30 | 0.67 |
| results of laying chips | number of chips laid successfully | number | 88 | 100 | 95 | 98 | 98 | 99 |
|  | number of chips laid successfully without damage | number | 88 | 100 | 93 | 98 | 98 | 99 |

TABLE 2-2

|  |  |  | Example 7 | Example 8 | Example 9 | Example 10 | Example 11 | Example 12 |
|---|---|---|---|---|---|---|---|---|
| laser-transparent substrate 1 | type | — | non-alkali glass | non-alkali glass | non-alkali glass | non-alkali glass | non-alkali glass | non-alkali glass |
| properties of resin film 1 | varnish | — | varnish 1-2 | varnish 1-2 | varnish 1-1 | varnish 1-1 | varnish 1-1 | varnish 1-1 |
|  | film production conditions | °C./min | 180/30 | 180/30 | 500/60 (in nitrogen atmosphere) | 250/30 | 500/10 (in nitrogen atmosphere) | 250/30 |
|  | absorbance at 248/μm | — | 2.45 | 2.45 | 4.53 | 4.49 | 4.49 | 4.53 |
|  | absorbance at 266/μm | — | 2.09 | 2.09 | 4.79 | 4.81 | 4.66 | 4.79 |
|  | absorbance at 308/μm | — | 2.61 | 2.61 | 3.59 | 3.65 | 3.46 | 3.59 |
|  | absorbance at 355/μm | — | 1.68 | 1.68 | 1.90 | 1.92 | 1.83 | 1.90 |
|  | absorbance at 532/μm | — | 0.00 | 0.00 | 0.05 | 0.06 | 0.04 | 0.05 |
|  | absorbance at 1,064/μm | — | 0.00 | 0.00 | 0.03 | 0.03 | 0.03 | 0.03 |
|  | elongation at break | % | 1.5 | 1.5 | 28 | 12 | 3.0 | 10 |
|  | t1 | μm | 2.0 | 2.0 | 2.0 | 2.0 | 2.0 | 2.0 |
| properties of resin film 2 | varnish | — | varnish 2-2 | varnish 2-2 | varnish 2-2 | varnish 2-2 | varnish 2-2 | varnish 2-2 |
|  | film production conditions | °C./min | 180/10 | 180/10 | 180/10 | 180/10 | 180/10 | 180/10 |
|  | elongation at break | % | 1,200 | 1,200 | 1,200 | 1,200 | 1,200 | 1,200 |
|  | t2 | μm | 5.0 | 0.5 | 5.0 | 5.0 | 5.0 | 5.0 |
|  | 1% weight loss temperature | °C. | 285 | 285 | 285 | 285 | 285 | 285 |
| properties of laminate | adhesive strength of surface of resin film 2 opposite to the one in contact with resin film 1 in laminate 1 | N/cm | 0.07 | 0.05 | 0.07 | 0.07 | 0.07 | 0.07 |
|  | adhesive strength of surface of resin film 2 opposite to the one in contact with resin film 1 in laminate 2 | N/cm | 0.07 | 0.05 | 0.07 | 0.07 | 0.07 | 0.07 |
|  | indentation hardness H1 | MPa | 3.8 | 3.8 | 1,150 | 600 | 950 | 56 |
|  | indentation hardness H2 | MPa | 2.0 | 2.3 | 2.0 | 2.0 | 2.0 | 2.0 |
|  | H1 > H2 satisfied |  | yes | yes | yes | yes | yes | yes |
|  | (t1 + t2) | μm | 7.0 | 2.5 | 7.0 | 7.0 | 7.0 | 7.0 |
|  | t1/t2 | — | 0.40 | 4.0 | 0.40 | 0.40 | 0.40 | 0.40 |

TABLE 2-2-continued

|  |  |  | Example 7 | Example 8 | Example 9 | Example 10 | Example 11 | Example 12 |
|---|---|---|---|---|---|---|---|---|
| results of laying chips | number of chips laid successfully | number | 98 | 95 | 98 | 99 | 95 | 98 |
|  | number of chips laid successfully without damage | number | 98 | 95 | 98 | 98 | 95 | 98 |

TABLE 3-1

|  |  |  | Example 13 | Example 14 | Example 15 | Example 16 | Example 17 | Example 18 | Example 19 |
|---|---|---|---|---|---|---|---|---|---|
| laser-transparent substrate 1 | type | — | non-alkali glass | non-alkali glass | non-alkali glass | non-alkali glass | non-alkali glass | non-alkali glass | quartz |
| properties of resin film 1 | varnish | — | varnish 1-1 | varnish 1-1 | varnish 1-1 | varnish 1-1 | varnish 1-1 | varnish 1-1 | varnish 1-1 |
|  | film production conditions | °C./min | 250/30 | 250/30 | 250/30 | 250/30 | 250/30 | 250/30 | 250/30 |
|  | absorbance at 248/μm | — | 4.53 | 4.53 | 4.53 | 4.53 | 4.53 | 4.53 | 4.53 |
|  | absorbance at 266/μm | — | 4.79 | 4.79 | 4.79 | 4.79 | 4.79 | 4.79 | 4.79 |
|  | absorbance at 308/μm | — | 3.59 | 3.59 | 3.59 | 3.59 | 3.59 | 3.59 | 3.59 |
|  | absorbance at 355/μm | — | 1.90 | 1.90 | 1.90 | 1.90 | 1.90 | 1.90 | 1.90 |
|  | absorbance at 532/μm | — | 0.05 | 0.05 | 0.05 | 0.05 | 0.05 | 0.05 | 0.05 |
|  | absorbance at 1,064/μm | — | 0.03 | 0.03 | 0.03 | 0.03 | 0.03 | 0.03 | 0.03 |
|  | elongation at break | % | 10 | 10 | 10 | 10 | 10 | 10 | 10 |
|  | t1 | μm | 2.0 | 2.0 | 2.0 | 2.0 | 2.0 | 5.0 | 2.0 |
| properties of resin film 2 | varnish | — | varnish 2-7 | varnish 2-7 | varnish 2-1 | varnish 2-4 | varnish 2-1 | varnish 2-1 | varnish 2-1 |
|  | film production conditions | °C./min | 180/10 | 250/10 | 180/10 | 180/10 | 225/10 | 225/10 | 225/10 |
|  | elongation at break | % | 80 | 120 | 550 | 900 | 500 | 500 | 500 |
|  | t2 | μm | 5.0 | 5.0 | 5.0 | 5.0 | 5.0 | 5.0 | 5.0 |
|  | 1% weight loss temperature | °C. | 285 | 285 | 285 | 290 | 369 | 369 | 369 |
| Properties of laminate | adhesive strength of surface of resin film 2 opposite to the one in contact with resin film 1 in laminate 1 | N/cm | 0.03 | 0.03 | 0.06 | 0.04 | 0.06 | 0.06 | 0.06 |
|  | adhesive strength of surface of resin film 2 opposite to the one in contact with resin film 1 in laminate 2 | N/cm | 0.03 | 0.03 | 0.06 | 0.04 | 0.06 | 0.06 | 0.06 |
|  | indentation hardness H1 | MPa | 330 | 330 | 330 | 330 | 330 | 330 | 330 |
|  | indentation hardness H2 | MPa | 16 | 43 | 2.2 | 2.1 | 2.3 | 2.3 | 2.3 |
|  | H1 > H2 satisfied |  | yes | yes | yes | yes | yes | yes | yes |
|  | (t1 + t2) | μm | 7.0 | 7.0 | 7.0 | 7.0 | 7.0 | 10 | 7.0 |
|  | t1/t2 | — | 0.40 | 0.40 | 0.40 | 0.40 | 0.40 | 1.0 | 0.40 |
| results of laying chips | number of chips laid successfully | number | 90 | 90 | 96 | 97 | 97 | 97 | 96 |
|  | number of chips laid successfully without damage | number | 90 | 88 | 96 | 97 | 97 | 97 | 96 |

TABLE 3-2

|  |  |  | Example 20 | Example 21 | Example 22 | Example 23 | Comparative example 1 | Comparative example 2 |
|---|---|---|---|---|---|---|---|---|
| laser-transparent substrate 1 | type | — | quartz | quartz | non-alkali glass | non-alkali glass | non-alkali glass | non-alkali glass |
| properties of resin film 1 | varnish | — | varnish 1-1 | varnish 1-1 | varnish 1-4 | varnish 1-4 | varnish 1-2 | varnish 1-2 |
|  | film production conditions | °C./min | 250/30 | 250/30 | 250/30 | 250/30 | 180/30 | 180/30 |
|  | absorbance at 248/μm | — | 4.53 | 4.53 | 5.10 | 5.10 | 2.45 | 2.45 |
|  | absorbance at 266/μm | — | 4.79 | 4.79 | 5.33 | 5.33 | 2.09 | 2.09 |
|  | absorbance at 308/μm | — | 3.59 | 3.59 | 4.42 | 4.42 | 2.61 | 2.61 |
|  | absorbance at 355/μm | — | 1.90 | 1.90 | 2.19 | 2.19 | 1.68 | 1.68 |
|  | absorbance at 532/μm | — | 0.05 | 0.05 | 0.46 | 0.46 | 0.00 | 0.00 |
|  | absorbance at 1,064/μm | — | 0.03 | 0.03 | 0.42 | 0.42 | 0.00 | 0.00 |
|  | elongation at break | % | 10 | 10 | 10 | 10 | 1.5 | 1.5 |
|  | t1 | μm | 2.0 | 2.0 | 2.0 | 2.0 | 2.0 | 2.0 |
| properties of resin film 2 | varnish | — | varnish 2-1 | varnish 2-1 | varnish 2-1 | varnish 2-1 | varnish 2-5 | varnish 2-6 |
|  | film production conditions | °C./min | 225/10 | 225/10 | 225/10 | 225/10 | 180/10 | 180/10 |
|  | elongation at break | % | 500 | 500 | 500 | 500 | 1,020 | 1,500 |
|  | t2 | μm | 5.0 | 5.0 | 5.0 | 5.0 | 30 | 30 |
|  | 1% weight loss temperature | °C. | 369 | 369 | 369 | 369 | 280 | 290 |
| properties of laminate | adhesive strength of surface of resin film 2 opposite to the one in contact with resin film 1 in laminate 1 | N/cm | 0.06 | 0.06 | 0.08 | 0.08 | 0.01 | 0.36 |
|  | adhesive strength of surface of resin film 2 opposite to the one in contact with resin film 1 in laminate 2 | N/cm | 0.06 | 0.06 | 0.08 | 0.08 | 0.01 | 0.36 |
|  | indentation hardness H1 | MPa | 330 | 330 | 330 | 330 | 3.8 | 3.8 |
|  | indentation hardness H2 | MPa | 2.3 | 2.3 | 2.2 | 2.3 | 1.6 | 0.5 |
|  | H1 > H2 satisfied |  | yes | yes | yes | yes | yes | yes |
|  | (t1 + t2) | μm | 7.0 | 7.0 | 7.0 | 7.0 | 32 | 32 |
|  | t1/t2 | — | 0.40 | 0.40 | 0.40 | 0.40 | 0.07 | 0.07 |
| results of layering chips | number of chips laid successfully | number | 97 | 98 | 98 | 99 | 0 | 100 |
|  | number of chips laid successfully without damage | number | 96 | 97 | 97 | 99 | 0 | 100 |

TABLE 4-1

|  |  |  |  | Example 1 | Example 2 | Example 3 | Example 4 | Example 5 | Example 6 |
|---|---|---|---|---|---|---|---|---|---|
| results of transferring chips | Wavelength of laser beam |  | nm | 355 | 355 | 355 | 355 | 355 | 355 |
|  | energy density of laser beam applied (mJ/cm²) | 150 | number of transferred chips | 1 | 0 | 1 | 2 | 2 | 2 |
|  |  |  | damage to chips | absent | not evaluated | absent | absent | absent | absent |
|  |  |  | positional accuracy | C |  | C | C | B | C |
|  |  |  | adhesive residue | B |  | C | C | C | B |
|  |  |  | debris | B |  | B | B | B | B |
|  |  | 200 | number of transferred chips | 2 | 1 | 2 | 2 | 3 | 3 |
|  |  |  | damage to chips | absent | absent | absent | absent | absent | absent |
|  |  |  | positional accuracy | C | C | B | B | A | A |
|  |  |  | adhesive residue | B | B | B | B | B | B |
|  |  |  | debris | B | B | B | B | B | B |
|  |  | 250 | number of transferred chips | 3 | 3 | 3 | 3 | 3 | 3 |
|  |  |  | damage to chips | absent | absent | absent | absent | absent | absent |
|  |  |  | positional accuracy | B | A | B | B | A | A |
|  |  |  | adhesive residue | B | B | B | B | B | B |
|  |  |  | debris | B | B | B | B | B | B |

TABLE 4-1-continued

|  |  |  |  | Example 1 | Example 2 | Example 3 | Example 4 | Example 5 | Example 6 |
|---|---|---|---|---|---|---|---|---|---|
|  |  | 300 | number of transferred chips | 3 | 3 | 3 | 3 | 3 | 3 |
|  |  |  | damage to chips | absent | absent | absent | absent | absent | absent |
|  |  |  | positional accuracy | B | B | B | B | A | A |
|  |  |  | adhesive residue | B | B | B | B | B | B |
|  |  |  | debris | B | B | B | B | B | B |
|  |  | 350 | number of transferred chips | 3 | 3 | 3 | 3 | 3 | 3 |
|  |  |  | damage to chips | absent | absent | absent | absent | absent | absent |
|  |  |  | positional accuracy | B | B | B | B | A | A |
|  |  |  | adhesive residue | B | C | B | B | B | B |
|  |  |  | debris | C | C | C | B | B | B |
|  |  | 400 | number of transferred chips | 3 | 3 | 3 | 3 | 3 | 3 |
|  |  |  | damage to chips | present | present | present | present | present | absent |
|  |  |  | positional accuracy | B | B | B | B | A | A |
|  |  |  | adhesive residue | B | C | C | C | B | B |
|  |  |  | debris | C | C | C | C | C | B |
| process margin | mJ/cm$^2$ |  |  | 250 to 300 | 250 to 300 | 200 to 300 | 200 to 350 | 200 to 350 | 200 to 400 |
|  | evaluation |  |  | B | B | A | A | A | A |

TABLE 4-2

|  |  |  |  | Example 7 | Example 8 | Example 9 | Example 10 | Example 11 | Example 12 |
|---|---|---|---|---|---|---|---|---|---|
| results of transferring chips | wavelength of laser beam | nm |  | 355 | 355 | 355 | 355 | 355 | 355 |
|  | energy density of laser beam applied (mJ/cm$^2$) | 150 | number of transferred chips | 2 | 2 | 3 | 3 | 3 | 3 |
|  |  |  | damage to chips | absent | absent | absent | absent | absent | absent |
|  |  |  | positional accuracy | B | B | B | B | B | B |
|  |  |  | adhesive residue | A | A | A | A | A | A |
|  |  |  | debris | A | A | A | A | A | A |
|  |  | 200 | number of transferred chips | 3 | 3 | 3 | 3 | 3 | 3 |
|  |  |  | damage to chips | absent | absent | absent | absent | absent | absent |
|  |  |  | positional accuracy | A | B | B | A | A | A |
|  |  |  | adhesive residue | B | A | B | A | B | B |
|  |  |  | debris | B | B | B | A | B | B |
|  |  | 250 | number of transferred chips | 3 | 3 | 3 | 3 | 3 | 3 |
|  |  |  | damage to chips | absent | absent | absent | absent | absent | absent |
|  |  |  | positional accuracy | B | B | A | A | A | A |
|  |  |  | adhesive residue | B | B | B | B | B | B |
|  |  |  | debris | B | B | B | B | B | B |
|  |  | 300 | number of transferred chips | 3 | 3 | 3 | 3 | 3 | 3 |
|  |  |  | damage to chips | absent | absent | absent | absent | absent | absent |
|  |  |  | positional accuracy | B | B | A | A | A | A |
|  |  |  | adhesive residue | B | B | B | B | B | B |
|  |  |  | debris | B | B | B | B | B | B |
|  |  | 350 | number of transferred chips | 3 | 3 | 3 | 3 | 3 | 3 |
|  |  |  | damage to chips | absent | absent | absent | absent | absent | absent |
|  |  |  | positional accuracy | A | A | A | A | A | A |
|  |  |  | adhesive residue | B | B | B | A | B | B |
|  |  |  | debris | B | A | B | B | B | B |

TABLE 4-2-continued

|  |  |  |  | Example 7 | Example 8 | Example 9 | Example 10 | Example 11 | Example 12 |
|---|---|---|---|---|---|---|---|---|---|
|  |  | 400 | number of transferred chips | 3 | 3 | 3 | 3 | 3 | 3 |
|  |  |  | damage to chips | absent | absent | absent | absent | absent | absent |
|  |  |  | positional accuracy | A | A | A | A | A | A |
|  |  |  | adhesive residue | B | A | B | B | A | B |
|  |  |  | debris | B | B | B | B | B | B |
| process margin | mJ/cm² |  |  | 150 to 400 | 150 to 400 | 150 to 400 | 150 to 400 | 150 to 400 | 150 to 400 |
|  | evaluation |  |  | A | A | A | A | A | A |

TABLE 5-1

|  |  |  |  | Example 13 | Example 14 | Example 15 | Example 16 | Example 17 | Example 18 | Example 19 |
|---|---|---|---|---|---|---|---|---|---|---|
| results of transferring chips | wavelength of laser beam | nm |  | 355 | 355 | 355 | 355 | 355 | 355 | 266 |
|  | energy density of laser beam applied (mJ/cm²) | 150 | number of transferred chips | 3 | 3 | 3 | 3 | 3 | 3 | 3 |
|  |  |  | damage to chips | absent | absent | absent | absent | absent | absent | absent |
|  |  |  | positional accuracy | B | B | B | B | A | A | A |
|  |  |  | adhesive residue | A | A | A | A | A | A | A |
|  |  |  | debris | A | A | A | A | A | A | A |
|  |  | 200 | number of transferred chips | 3 | 3 | 3 | 3 | 3 | 3 | 3 |
|  |  |  | damage to chips | absent | absent | absent | absent | absent | absent | absent |
|  |  |  | positional accuracy | A | A | A | A | A | A | A |
|  |  |  | adhesive residue | A | A | A | A | A | A | A |
|  |  |  | debris | A | A | A | A | A | A | A |
|  |  | 250 | number of transferred chips | 3 | 3 | 3 | 3 | 3 | 3 | 3 |
|  |  |  | damage to chips | absent | absent | absent | absent | absent | absent | absent |
|  |  |  | positional accuracy | A | A | A | A | A | A | A |
|  |  |  | adhesive residue | A | A | A | A | A | A | A |
|  |  |  | debris | A | A | A | A | A | A | A |
|  |  | 300 | number of transferred chips | 3 | 3 | 3 | 3 | 3 | 3 | 3 |
|  |  |  | damage to chips | absent | absent | absent | absent | absent | absent | absent |
|  |  |  | positional accuracy | A | A | A | A | A | A | A |
|  |  |  | adhesive residue | A | A | A | A | A | A | A |
|  |  |  | debris | B | A | A | A | A | A | A |
|  |  | 350 | number of transferred chips | 3 | 3 | 3 | 3 | 3 | 3 | 3 |
|  |  |  | damage to chips | absent | absent | absent | absent | absent | absent | absent |
|  |  |  | positional accuracy | A | A | A | A | A | A | A |
|  |  |  | adhesive residue | A | A | A | A | A | A | A |
|  |  |  | debris | B | B | B | B | A | A | A |
|  |  | 400 | number of transferred chips | 3 | 3 | 3 | 3 | 3 | 3 | 3 |
|  |  |  | damage to chips | absent | absent | absent | absent | absent | absent | absent |
|  |  |  | positional accuracy | A | A | A | A | A | A | A |
|  |  |  | adhesive residue | B | B | B | B | A | A | A |
|  |  |  | debris | C | B | B | B | A | A | A |
| process margin | mJ/cm² |  |  | 150 to 350 | 150 to 400 | 150 to 400 | 150 to 400 | 150 to 400 | 150 to 400 | 150 to 400 |
|  | evaluation |  |  | A | A | A | A | A | A | A |

TABLE 5-2

| | | | | Example 20 | Example 21 | Example 22 | Example 23 | Comparative example 1 | Comparative example 2 |
|---|---|---|---|---|---|---|---|---|---|
| results of transferring chips | wavelength of laser beam | | nm | 248 | 308 | 532 | 1,064 | 355 | 355 |
| | energy density of laser beam applied (mJ/cm²) | 150 | number of transferred chips | 3 | 3 | 3 | 3 | not evaluated due to failure in laying chips on resin film 2 | 0 |
| | | | damage to chips | absent | absent | absent | absent | | unevaluated due to failure in transferring chips |
| | | | positional accuracy | A | A | B | B | | |
| | | | adhesive residue | A | B | A | A | | |
| | | | debris | A | A | A | A | | |
| | | 200 | number of transferred chips | 3 | 3 | 3 | 3 | | 0 |
| | | | damage to chips | absent | absent | absent | absent | | unevaluated due to failure in transferring chips |
| | | | positional accuracy | A | A | B | B | | |
| | | | adhesive residue | A | A | A | A | | |
| | | | debris | A | A | A | A | | |
| | | 250 | number of transferred chips | 3 | 3 | 3 | 3 | | 0 |
| | | | damage to chips | absent | absent | absent | absent | | unevaluated due to failure in transferring chips |
| | | | positional accuracy | A | A | B | B | | |
| | | | adhesive residue | A | A | A | A | | |
| | | | debris | A | A | A | A | | |
| | | 300 | number of transferred chips | 3 | 3 | 3 | 3 | | 0 |
| | | | damage to chips | absent | absent | absent | absent | | unevaluated due to failure in transferring chips |
| | | | positional accuracy | A | A | A | B | | |
| | | | adhesive residue | A | A | A | A | | |
| | | | debris | A | A | A | A | | |
| | | 350 | number of transferred chips | 3 | 3 | 3 | 3 | | 0 |
| | | | damage to chips | absent | absent | absent | absent | | unevaluated due to failure in transferring chips |
| | | | positional accuracy | A | A | A | A | | |
| | | | adhesive residue | A | A | A | A | | |
| | | | debris | B | A | A | A | | |
| | | 400 | number of transferred chips | 3 | 3 | 3 | 3 | | 1 |
| | | | damage to chips | absent | absent | absent | absent | | present |
| | | | positional accuracy | A | A | A | A | | C |
| | | | adhesive residue | A | B | A | A | | C |
| | | | debris | B | A | A | A | | C |
| | process margin | mJ/cm² | | 150 to 400 | 150 to 400 | 150 to 400 | 150 to 400 | unevaluated | <50 |
| | | evaluation | | A | A | A | A | C | C |

EXPLANATION OF NUMERALS

11 substrate 1 with laser transparency
12 resin film 1
13 resin film 2
14 semiconductor element
15 support body
16 temporary adhesive
17 substrate for crystal growth
18 semiconductor substrate
21 substrate 2
31 laser
41 press-bonding device
51 photomask
110 laminate 1
120 laminate 2
130 substrate having temporary bonded semiconductor elements
140 substrate having semiconductor elements

The invention claimed is:

1. A laminate comprising a first substrate with laser transparency, a first resin film, and a second resin film stacked in this order wherein:
the absorbance of the first resin film converted to a film thickness of 1.0 μm is 0.4 or more and 5.0 or less at a wavelength in the range of 200 to 1,100 nm; and
the surface of the second resin film opposite to the one in contact with the first resin film has an adhesive strength of 0.02 N/cm or more and 0.3 N/cm or less.

2. A laminate comprising a first substrate with laser transparency, a first resin film, a second resin film, and semiconductor elements stacked in this order wherein:
the absorbance of the first resin film converted to a film thickness of 1.0 μm is 0.4 or more and 5.0 or less at a wavelength in the range of 200 to 1,100 nm; and
the adhesive strength at the face where the second resin film and the semiconductor elements are in contact with each other is 0.02 N/cm or more and 0.3 N/cm or less.

3. A laminate as set forth in either claim 1 wherein the absorbance of the first resin film converted to a film thickness of 1.0 μm is 0.4 or more and 5.0 or less at a wavelength selected from 248 nm, 266 nm, 308 nm, 355 nm, 532 nm, and 1,064 nm.

4. A laminate as set forth in claim 1 wherein the absorbance of the first resin film converted to a film thickness of 1.0 μm is 0.4 or more and 5.0 or less at a wavelength selected from 248 nm, 266 nm, and 355 nm.

5. A laminate as set forth in claim 1 having an indentation hardness H2 of 2 MPa or more and 500 MPa or less as measured by making an indentation in the direction from the second resin film toward the first substrate and also satisfying the relation H1>H2 where H1 is the indentation hardness that is measured by making an indentation in the direction from the first resin film toward the first substrate after removing the second resin film from the laminate.

6. A laminate as set forth in claim 1 wherein the value of (t1+t2), where t1 (μm) and t2 (μm) are the thickness of the first resin film [1] and that of the second resin film, respectively, is 1.0 μm or more and 30 μm or less, and the ratio of t1/t2 is 0.1 or more and 5.0 or less.

7. A laminate as set forth in claim 1 wherein the first resin film has an elongation at break of 2.0% or more and 30% or less.

8. A laminate as set forth in claim 1 wherein the indentation hardness H1 that is measured by making an indentation in the direction from the first resin film toward the substrate 1 is 50 MPa or more and 1,000 MPa or less.

9. A laminate as set forth in claim 1 wherein the second resin film has an elongation at break of 100% or more and 1,000% or less.

10. A laminate as set forth in claim 1 wherein the first resin film comprises one or more selected from the group consisting of a polyimide having a structure as represented by the formula (1), a polyimide precursor having a structure as represented by the formula (2), a polybenzoxazole having a structure as represented by the formula (3), a polybenzoxazole precursor having a structure as represented by the formula (4), and copolymers thereof:

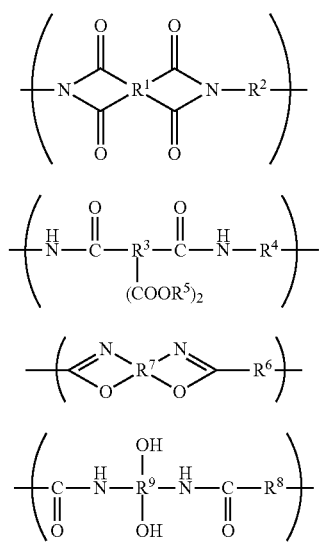

wherein in the formulae (1) to (4), $R^1$, $R^3$, $R^7$, and $R^9$ each independently represent a tetravalent organic group having 6 to 40 carbon atoms; $R^2$, $R^4$, $R^6$, and $R^8$ each independently represent a divalent organic group having 2 to 40 carbon atoms; and $R^5$ represents a hydrogen atom or a monovalent organic group having 1 to 20 carbon atoms.

11. A laminate as set forth in claim 1 wherein the resin contained in the second resin film comprises one or more structures selected from the group consisting of a dimethylsiloxane structure as represented by the formula (5), a diphenylsiloxane structure as represented by the formula (6), an alkylene glycol structure as represented by the formula (7), and an alkylene structure as represented by the formula (8):

[Chemical compound 2]

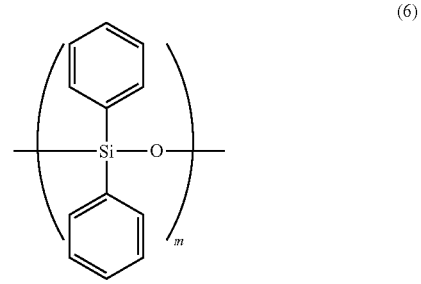

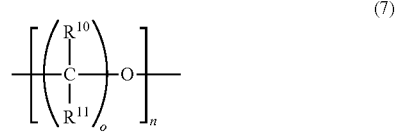

wherein in the formulae (5) to (8), $R^{10}$ to $R^{13}$ each independently represent a hydrogen atom or a monovalent organic group having 1 to 20 carbon atoms; l, m, and n each independently represent an integer of 4 to 40; p represents an integer of 10 to 40; and o represents an integer of 1 to 16.

12. A laminate as set forth in claim 1 wherein the resin contained in the second resin film is polyimide siloxane.

13. A laminate as set forth in claim 1 wherein the second resin film contains a crosslinking agent.

14. A laminate as set forth in claim 1 wherein the second resin film has a 1% weight loss temperature of 300° C. or more.

15. A production method for a semiconductor device using a laminate as set forth in claim 2 and comprising a step for disposing the laminate so that its semiconductor element plane faces a second substrate and a subsequent step for applying a laser beam through the first substrate with laser transparency present in the laminate to transfer a semiconductor element to the second substrate.

16. A production method for a semiconductor device as set forth in claim 15 wherein the laser beam has a wavelength of 248 nm, 266 nm, 308 nm, 355 nm, 532 nm, or 1,064 nm.

17. A production method for a semiconductor device as set forth in claim 15 wherein the second substrate is a circuit board.

* * * * *